(12) United States Patent
Andou et al.

(10) Patent No.: US 8,728,716 B2
(45) Date of Patent: May 20, 2014

(54) RESIN PATTERN, METHOD FOR PRODUCING THE PATTERN, METHOD FOR PRODUCING MEMS STRUCTURE, METHOD FOR MANUFACTURING SEMICONDUCTOR DEVICE, AND METHOD FOR PRODUCING PLATED PATTERN

(75) Inventors: Takeshi Andou, Shizuoka (JP); Junichi Fujimori, Shizuoka (JP); Hiroyuki Yonezawa, Shizuoka (JP); Yasumasa Kawabe, Shizuoka (JP); Hideyuki Nakamura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 11 days.

(21) Appl. No.: 13/416,870

(22) Filed: Mar. 9, 2012

(65) Prior Publication Data
US 2012/0231396 A1 Sep. 13, 2012

(30) Foreign Application Priority Data

Mar. 11, 2011 (JP) ................................. 2011-054358
May 2, 2011 (JP) ................................. 2011-102973

(51) Int. Cl.
*G03F 7/26* (2006.01)
(52) U.S. Cl.
USPC .......................................... 430/315; 430/330
(58) Field of Classification Search
USPC ........................ 430/315, 330, 394, 328, 324
See application file for complete search history.

(56) References Cited

U.S. PATENT DOCUMENTS

| 5,858,620 A * | 1/1999 | Ishibashi et al. ............. 430/313 |
| 6,486,058 B1 * | 11/2002 | Chun ............................. 438/637 |
| 2008/0241759 A1 * | 10/2008 | Mizutani et al. ............. 430/315 |
| 2010/0173246 A1 * | 7/2010 | Takita ........................ 430/280.1 |
| 2010/0316802 A1 * | 12/2010 | Sugeta et al. ................. 427/256 |

FOREIGN PATENT DOCUMENTS

| JP | 02-110462 | * | 4/1990 |
| JP | 07-045510 | A | 2/1995 |
| JP | 10-073923 | A | 3/1998 |
| JP | 11-283910 | A | 10/1999 |
| JP | 2001-242636 | A | 9/2001 |
| JP | 2004-163923 | A | 6/2004 |
| JP | 2007-186599 | A | 7/2007 |
| JP | 2008-533510 | A | 8/2008 |
| JP | 2009-098616 | A | 5/2009 |
| JP | 2009-111434 | A | 5/2009 |
| WO | WO 2006/091860 | A2 | 8/2006 |

OTHER PUBLICATIONS

Office Action dated Mar. 12, 2013 in Japanese Application No. 2011-102973.

* cited by examiner

*Primary Examiner* — Caleen Sullivan
(74) *Attorney, Agent, or Firm* — Sughrue Mion, PLLC

(57) ABSTRACT

There is provided that a method for producing a resin pattern, and the method includes at least the steps (1) to (7) in this order; (1) a coating step of coating a photosensitive resin composition on a substrate; (2) a solvent removal step of removing the solvent from the applied photosensitive resin composition; (3) an exposure step of patternwise exposing the photosensitive resin composition from which the solvent has been removed, to an active radiation; (4) a development step of developing the exposed photosensitive resin composition using an aqueous developer liquid; (5) an overcoating step of providing an overcoat layer on the developed photosensitive resin composition; (6) a heat-treating step of heat-treating the photosensitive resin composition on which the overcoat layer has been provided; and (7) a removal step of removing the overcoat layer.

16 Claims, 3 Drawing Sheets

RESIN PATTERN, METHOD FOR PRODUCING THE PATTERN, METHOD FOR PRODUCING MEMS STRUCTURE, METHOD FOR MANUFACTURING SEMICONDUCTOR DEVICE, AND METHOD FOR PRODUCING PLATED PATTERN

TECHNICAL FIELD

The present invention relates to a resin pattern, a method for producing the pattern, a method for producing a MEMS structure, a method for manufacturing a semiconductor device, and a method for producing a plated pattern.

BACKGROUND ART

In production processes of liquid crystal display apparatuses, organic EL display apparatuses, semiconductor devices, MEMS and the like, photosensitive resin compositions have been used as etching resists or structures.

As a conventional photosensitive resin composition, for example, JP-A-10-73923 (JP-A denotes a Japanese unexamined patent application publication) suggests a positive type photosensitive resin composition for etching resists.

JP-T-2008-533510 (JP-T denotes a published Japanese translation of a PCT application) discloses an example of the production of a MEMS structure using a sacrificial layer resist.

DISCLOSURE OF THE PRESENT INVENTION

Problems that the Present Invention is to Solve

For example, in a production of an MEMS, the control of the shape of the resist is important.

Furthermore, when a resist is used as an etching resist in a dry etching process, it is required to form a profile with a large taper angle in a rectangular shape, in order to realize production of a precise pattern by etching.

In a conventional photosensitive resin composition, it has been difficult to obtain a profile that is rectangular or close to a rectangle, when a heat treatment (bake) for enhancing a cured film strength is carried out.

For example, the photosensitive resin composition described in JP-A-10-73923 has a problem in that a rectangular profile cannot be obtained due to heat flow at the time of a bake process.

A problem that is to be solved by the present invention is to provide a method for producing a resin pattern, which is capable of forming a resin pattern that is rectangular or close to a rectangle even after heat treatment of the formed resin pattern.

The problem to be solved by the present invention has been solved by the means described in the following items <1> or <15> to <19>. These means will be described below together with items <2> to <14>, which are preferable embodiments.

<1> A method for producing a resin pattern, the method of which is characterized by including at least the steps (1) to (7) in this order:

(1) A coating step of coating a photosensitive resin composition on a substrate;

(2) A solvent removal step of removing the solvent from the applied photosensitive resin composition;

(3) An exposure step of patternwise exposing the photosensitive resin composition from which the solvent has been removed, to an active radiation;

(4) A development step of developing the exposed photosensitive resin composition using an aqueous developer liquid;

(5) An overcoating step of providing an overcoat layer on the developed photosensitive resin composition;

(6) A heat-treating step of heat-treating the photosensitive resin composition on which the overcoat layer has been provided; and (7) a removal step of removing the overcoat layer;

<2> The method for producing a resin pattern according to item <1>, wherein the overcoat layer contains polyvinyl alcohol or poly(meth)acrylic acid ester copolymer;

<3> The method for producing a resin pattern according to item <1> or <2>, wherein the method further includes a post-exposure step of performing full-area exposure of the substrate with a pattern formed thereon to active radiation, between step (4) and step (5), or between step (5) and step (6);

<4> The method for producing a resin pattern according to any one of items <1> to <3>, wherein the cross-sectional taper angle of the resin pattern after the heat treatment step of step (6) is 70° or larger;

<5> The method for producing a resin pattern according to any one of items <1> to <4>, wherein the thickness of the resin pattern after the heat treatment step of step (6) is 4 μm to 100 μm;

<6> The method for producing a resin pattern according to any one of items <1> to <5>, wherein the photosensitive resin composition contains the following components: (Component A1) a polymer including a monomer unit (a1-1) having a residue of a carboxyl group or a phenolic hydroxyl group protected with an acid-decomposable group, and a monomer unit (a1-2) having an epoxy group and/or an oxetanyl group; (Component B1) a photo acid generator; and (Component C1) a solvent;

<7> The method for producing a resin pattern according to any one of items <1> to <6>, wherein the photosensitive resin composition further contains (Component D1) a thermal crosslinking agent;

<8> The method for producing a resin pattern according to item <7>, wherein Component D1 includes a blocked isocyanate compound;

<9> The method for producing a resin pattern according to any one of items <6> to <8>, wherein Component A1 further has a monomer unit (a1-3) having a cyclic structure, in addition to the monomer units (a1-1) and (a1-2);

<10> The method for producing a resin pattern according to any one of items <6> to <9>, wherein Component A1 further has a monomer unit (a1-4) having a carboxyl group or a hydroxyl group, in addition to the monomer units (a1-1) and (a1-2);

<11> The method for producing a resin pattern according to any one of items <6> to <10>, wherein the content of the monomer unit (a1-1) in Component A1 is 45 mol % or less based on all the monomer units of Component A1;

<12> The method for producing a resin pattern according to any one of items <1> to <11>, wherein the photosensitive resin composition is a chemically amplified positive type photosensitive resin composition;

<13> The method for producing a resin pattern according to any one of items <1> to <5>, wherein the photosensitive resin composition contains the following components: (Component A2) a polymer including a constitutional unit (a2-1) having a carboxyl group or a phenolic hydroxyl group, and a constitutional unit (a2-2) having an epoxy group and/or an oxetanyl group; (Component B2) a quinonediazide compound; and (Component C2) a solvent;

<14> The method for producing a resin pattern according to any one of items <1> to <5>, wherein the photosensitive resin composition contains the following components: (Component A3) a polymer having a carboxyl group or a phenolic hydroxyl group; (Component B3) a photopolymerization initiator; (Component C3) a solvent; and (Component D3) a polymerizable monomer;

<15> A resin pattern produced by the method for producing a resin pattern according to any one of items <1> to <14>;

<16> A method for producing a MEMS structure, the method including producing the structure using the resin pattern according to item <15> as a sacrificial layer at the time of lamination of the structure;

<17> A method for producing a MEMS structure, the method including using the resin pattern according to item <15> as the structural component;

<18> A method for manufacturing a semiconductor device, the method including producing a resin pattern on a substrate using the resin pattern according to item <15> as an etching resist; and <19> A method for producing a plated pattern, the method including producing the plated pattern by plating the resin pattern according to item <15> as a template.

EXPLANATION OF REFERENCE NUMERALS AND SYMBOLS

Figure 1:
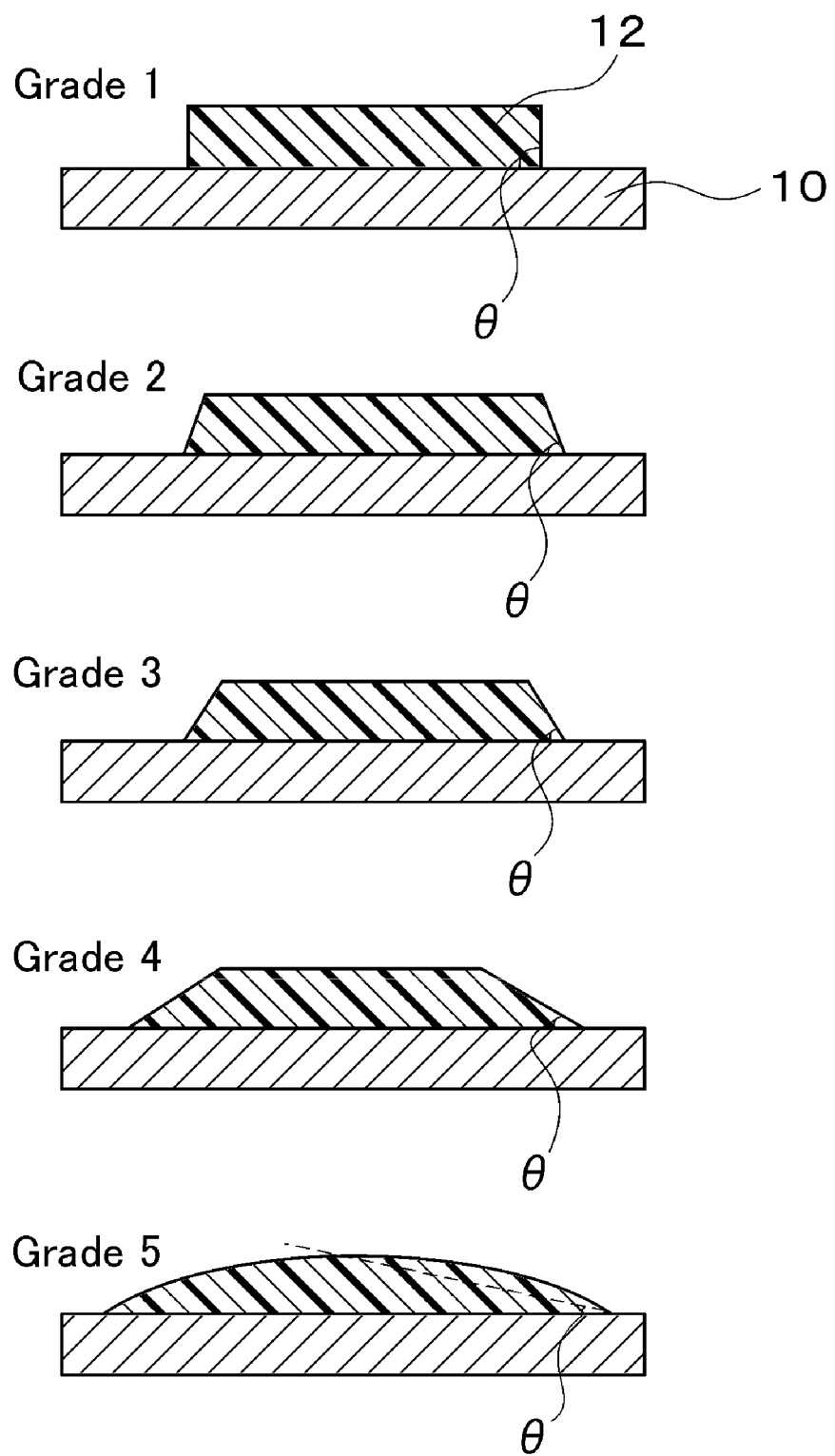
FIG. 1 is a schematic diagram showing the cross-section profile after heat treatment.

10: Substrate
12: Resin pattern
14: Upper end of the resin pattern
16: Lower end of the resin pattern
θ: Taper angle

BEST MODE FOR CARRYING OUT THE PRESENT INVENTION

Hereinafter, the method for producing a resin pattern of the present invention will be described in detail.

According to the present invention, the description of "lower limit to upper limit", which indicates a range of values, indicates "equal to or more than the lower limit and equal to or less than the upper limit," and the description of "upper limit to lower limit" indicates "equal to or less than the upper limit and equal to or more than the lower limit." That is, the descriptions indicate the ranges of values including the upper limit and the lower limit.

According to the present invention, the "(Component A1) polymer including a monomer unit (a1-1) having a residue of a carboxyl group or a phenolic hydroxyl group protected with an acid-decomposable group, and a monomer unit (a1-2) having an epoxy group and/or an oxetanyl group" or the like will be also simply referred to as "Component A" or the like, and the "monomer unit (a1-1) having a residue of a carboxyl group or a phenolic hydroxyl group protected with an acid-decomposable group" or the like will be also simply referred to as "monomer unit (a1-1)" or the like.

(Method for Producing a Resin Pattern)

The method for producing a resin pattern of the present invention is characterized by including at least the steps (1) to (7) in this order:

(1) A coating step of coating a photosensitive resin composition on a substrate;

(2) A solvent removal step of removing the solvent from the applied photosensitive resin composition;

(3) An exposure step of patternwise exposing the photosensitive resin composition from which the solvent has been removed, to an active radiation;

(4) A development step of developing the exposed photosensitive resin composition using an aqueous developer liquid;

(5) An overcoating step of providing an overcoat layer on the developed photosensitive resin composition;

(6) A heat-treating step of heat-treating the photosensitive resin composition on which the overcoat layer has been provided; and (7) A removal step of removing the overcoat layer.

Hereinafter, the respective steps will be described in order.

<Coating Step (Step (1))>

The method for producing a resin pattern of the present invention includes (1) a coating step of coating a photosensitive resin composition on a substrate.

In the step (1), it is preferable that the photosensitive resin composition be applied on a given substrate, and the solvent be removed under reduced pressure and/or by heating (prebake), and thereby a desired dry film be formed.

Examples of the substrate material that can be used in the present invention include silicon, silicon dioxide, silicon nitride, alumina, glass, glass-ceramics, gallium arsenide, indium phosphide, copper, aluminum, nickel, iron, steel, a copper-silicon alloy, indium tin oxide-coated glass; organic films of polyimides and polyesters; and any substrates including patterned regions of metal, semiconductors and insulating materials, but the examples are not limited to these. In some cases, a bake step can be carried out on the substrate, before the photosensitive resin composition is applied, in order to remove the absorbed moisture. There are no particular limitations on the coating method of the substrate, and for example, methods such as a slit coating method, a spray method, a roll coating method, or a rotary coating method can be used. In the case of a large-sized substrate, the slit coating method is preferable over the others. Here, a large-sized substrate means a substrate having a size which measures from 1 to 5 m on each side.

Here, in step (1), in a case of being applied to flexible films such as polyimides and polyesters as a substrate, a transfer material having the photosensitive resin composition would be obtained. In this case, after the solvent removal step and before the exposure step, it is transferred to a non-flexible substrate such as a glass substrate. A method for producing a resin pattern in the case of forming a resin pattern as a transfer material can also be made with reference to JP-A-2010-72589 or the like.

Furthermore, the photosensitive resin composition which can be used in the step (1) will be described below.

<Solvent Removal Step (Step (2))>

The method for producing a resin pattern of the present invention includes (2) a solvent removal step of removing the solvent from the applied photosensitive resin composition.

In the step, it is preferable that the solvent be removed from the film applied under reduced pressure (vacuum) and/or by heating, and thereby a dry coating film be formed on the substrate. The heating conditions are preferably for about 30 to 300 seconds at 70° C. to 120° C.

The method for producing a resin pattern of the present invention is, because of a satisfactory shape controllability thereof, suitably used for the production of a thick film pattern, which has a film thickness after the solvent removal of 4 μm or greater. The film thickness after the solvent removal is preferably 4 to 500 μm, and 4 to 100 μm is particularly preferable.

<Exposure Step (Step (3))>

The method for producing a resin pattern of the present invention includes (3) an exposure step of patternwise exposing the photosensitive resin composition from which the solvent has been removed, to an active radiation.

In the (3) exposure step, the substrate provided with a dry coating film is irradiated with an active radiation. The exposure may be carried out via a mask, or a predetermined pattern may be directly drawn. An active radiation having a wavelength of from 300 nm to 450 nm can be used preferably. For the exposure to an active radiation, a low pressure mercury lamp, a high pressure mercury lamp, an ultrahigh pressure mercury lamp, a chemical lamp, a laser generating apparatus, an LED light source or the like can be used.

In the case of using a mercury lamp, an active radiation having a wavelength of g-line (436 nm), i-line (365 nm), or h-line (405 nm) can be preferably used. A mercury lamp is more advantageous than laser light from the viewpoint that the mercury lamp is appropriate for exposure of a large area.

When a laser is used, 343 nm or 355 nm are used in the case of a solid (YAG) laser, and 351 nm (XeF) is used in the case of an excimer laser. Furthermore, 375 nm or 405 nm are used in the case of a semiconductor laser. Among these, 355 nm or 405 nm are more preferable from the viewpoints of stability and cost. Laser light can be irradiated on the coating film in a single dose or in several divided doses.

The energy density per pulse of laser light is preferably 0.1 to 10,000 mJ/cm$^2$. In order to sufficiently cure the coating film, an energy density of 0.3 mJ/cm$^2$ or greater is more preferable, and 0.5 mJ/cm$^2$ or greater is most preferable. In order to prevent the decomposition of the coating film due to an abrasion phenomenon, an energy density of 1,000 mJ/cm$^2$ or less is more preferable, and 100 mJ/cm$^2$ or less is most preferable. Furthermore, the pulse width is preferably from 0.1 nsec to 30,000 nsec. In order to prevent the decomposition of a color coating film due to an abrasion phenomenon, a pulse width of 0.5 nsec or longer is more preferable, and 1 nsec or longer is most preferable. In order to increase the alignment accuracy at the time of scan exposure, a pulse width of 1,000 nsec or shorter is more preferable, and 50 nsec or shorter is most preferable.

Furthermore, the frequency of the laser is preferably from 1 Hz to 50,000 Hz. In order to shorten the exposure treatment time, the frequency is more preferably 10 Hz or greater, and most preferably 100 Hz or greater. In order to increase the alignment accuracy at the time of scan exposure, the frequency is more preferably 10,000 Hz or less, and most preferably 1,000 Hz or less.

A laser is more advantageous than a mercury lamp, from the viewpoint that focusing is easy, a mask for the pattern formation in the exposure step is unnecessary, and the cost can be reduced.

The exposing apparatus that can be used in the present invention is not particularly limited, but commercially available products such as Callisto (manufactured by V Technology Co., Ltd.), AEGIS (manufactured by V Technology Co., Ltd.), DF2200G (manufactured by Dainippon Screen Co., Ltd.) or the like can be used. Apparatuses other than those described above can also be suitably used.

Furthermore, if necessary, the irradiation light can also be regulated through a spectrometric filter such as a long wavelength cutoff filter, a short wavelength cutoff filter, or a band pass filter.

In a case of using a photosensitive composition of the first embodiment, after the exposure step and before the development step, PEB (post-exposure bake) can be carried out as necessary. When the PEB is carried out, the temperature is preferably 30° C. to 130° C., more preferably 40° C. to 110° C., and particularly preferably 50° C. to 90° C.

<Development Step (Step (4))>

The method for producing a resin pattern of the present invention includes (4) a development step of developing the exposed photosensitive resin composition using an aqueous developer liquid.

In the development step of (4), the exposed photosensitive resin composition is developed using an aqueous developer liquid.

The aqueous developer liquid is preferably an alkaline developer liquid, and as the basic compound that can be used in the alkaline developer liquid, for example, aqueous solutions of alkali metal hydroxides such as lithium hydroxide, sodium hydroxide, and potassium hydroxide; alkali metal carbonates such as sodium carbonate and potassium carbonate; alkali metal hydrogen carbonates such as sodium hydrogen carbonate and potassium hydrogen carbonate; ammonium hydroxides such as tetramethylammonium hydroxide, tetraethylammonium hydroxide, and choline hydroxide; sodium silicate and sodium metasilicate can be used. Furthermore, an aqueous solution prepared by adding an appropriate amount of a water-soluble organic solvent such as methanol or ethanol, or a surfactant to an aqueous solution of an alkali can also be used as the developer liquid.

The pH of the developer liquid is preferably 10.0 to 14.0.

The development time is preferably 30 to 180 seconds, and the technique of development may be any of a paddling method, a dipping method, a showering method and the like. After the development, it is preferable to perform washing under flowing water for 10 to 90 seconds, and to thereby form a desired pattern.

Furthermore, the method for producing a resin pattern of the present invention preferably includes a re-exposure step of re-exposing the substrate with a pattern formed thereon to an active radiation, either between step (4) and step (5), or between step (5) and step (6).

The exposure in the re-exposure step may be carried out by the same means as used in the exposure step, but in the re-exposure step, it is preferable to perform full-area exposure on the side of the substrate where a film of the photosensitive resin composition has been formed.

A preferable amount of exposure for the re-exposure step is 100 to 1,000 mJ/cm$^2$.

<Overcoating Step (Step (5))>

The method for producing a resin pattern of the present invention includes (5) an overcoating step of providing an overcoat layer on the developed photosensitive resin composition.

The coating refers to coating and solvent removal, and is performed throughout an entire area of the resin pattern. In this case, the overcoat layer is formed so as to fill up the grooves of the already formed resin pattern, and the surface of the overcoat layer becomes nearly flat.

In the presence of this overcoat layer, by performing the heat treatment (bake) to be described, a pattern that has a larger taper angle or having an angle that is closer to rectangular, can be obtained.

The material of the overcoat layer is not particularly limited, as long as it is neither melted during the baking nor thermally decomposed, but can be removed after baking.

As the material used to form an overcoat layer, polymers which do not have an adverse effect on the production of semiconductors, and are excellent in heat resistance are preferably used, and the examples thereof include animal proteins (glue, casein, gelatin, egg white or the like), semi-synthetic polymers (methyl celluloses, ethyl cellulose, carboxymethyl cellulose (CMC), or the like), plant-derived polysaccharides (corn starch, gum arabic, or the like), and synthetic polymers. Among these, semi-synthetic polymers such as celluloses or starches, and synthetic polymers represented by polyvinyl alcohol or poly(meth)acrylic acid ester copolymer are preferable. The overcoat layer can be coated and provided on a resin pattern from a solution where these polymers have been dissolved in a solvent such as water or organic solvents.

The semi-synthetic polymers are preferably dextrins, and celluloses; more preferably natural cyclodextrins, methyl cellulose, ethyl cellulose, methyl hydroxy cellulose, hydroxyethyl cellulose, and hydroxypropyl cellulose; yet more preferably α-cyclodextrin and hydroxypropyl methylcellulose; and particularly preferably hydroxypropyl methylcellulose.

Examples of the synthetic polymers include polyester resins, acrylic resins, and vinyl resins, and specifically, preferably, acrylic resins such as poly(meth)acrylic acid ester copolymer, sodium poly(meth)acrylate, and poly(meth)acrylic amide; vinyl resins such as polyvinyl alcohol, and polyvinyl pyrrolidone, more preferably poly(meth)acrylate copolymer, and polyvinyl alcohol (PVA), and particularly preferably polyvinyl alcohol (PVA) can be used.

The above-mentioned poly(meth)acrylic acid ester copolymers are preferably an ester of poly(meth)acrylic acid with an aliphatic or aromatic alcohol having 1 to 10 carbon atoms, and a random copolymer with (meth)acrylic acid, and the copolymerization ratio thereof is more preferably in the range of 60 to 90 mol % of (meth)acrylic acid ester and 40 to 10 mol % of (meth)acrylic acid. The (meth)acrylic acid ester includes an ester of a lower alcohol having 1 to 5 carbon atoms with (meth)acrylic acid such as methyl methacrylate; and an ester of an aralkyl alcohol having 7 to 10 carbon atoms with (meth) acrylic acid such as benzyl methacrylate. In the copolymer, the monomer unit derived from a (meth)acrylic acid may be partially such as a tetramethylammonium salt. The weight average molecular weight is preferably 2,000 to 50,000, from the viewpoint of the coating suitability.

Specific examples of the poly(meth)acrylic acid ester copolymer include methyl methacrylate-methacrylic acid copolymer (copolymerization ratio of 90:10 mol %, weight average molecular weight of about 12,000), and benzyl methacrylate-methacrylic acid copolymer (copolymerization ratio of 80:20 mol %, weight average molecular weight of 10,000).

The overcoat layer can be coated and provided from a solution of the above-mentioned poly(meth)acrylic acid ester copolymer in a glycol-based solvent such as propylene glycol monomethyl ether acetate, and the overcoat layer is removed by a dilute alkali aqueous solution such as an aqueous solution of tetramethylammonium hydroxide.

PVA is crystallized by heating in order for the hydroxyl group thereof to form hydrogen bonds, and thereby a satisfactory heat resistance can be obtained, and thermal sagging of the resin pattern can be prevented.

For polyvinyl alcohol, as listed below, grades may gave a variety of saponification degrees and polymerization degrees, and modified polyvinyl alcohol can be used. PVA is commercially available from many manufacturers, and the manufacturers include Kuraray Co., Ltd., and Kuraray Poval (registered trademark) is commercially available.

The above-mentioned PVA is largely classified as each of a grade having complete saponification (saponification degree of about 98 to 99%), intermediate saponification (saponification degree of about 90.5 to 96.5%), and partial saponification (saponification degree of about 87 to 89% or about 71 to 83%), and PVA having the partial saponification, such as PVA 203, PVA 205, and PVA 210 can be preferably used.

Partially saponified polyvinyl alcohol is readily soluble in cold water, and is completely soluble at a high temperature, and thereby is used for coating. PVA having a high saponification degree requires a high temperature and time for complete dissolution.

Furthermore, in order to coat and provide the overcoat layer, a known method such as spin coating, and spray coating can be used. A preferable polymerization degree of PVA is about 400 to 600, and the protective film is applied and dried, from an aqueous solution having a viscosity about 4 to 10 mPa·sec at 20° C.

A dry thickness of the overcoat layer can be appropriately selected. As a typical thickness, on a resin pattern having a thickness of about 4 μm, the overcoat layer is coated and provided preferably so as to be a layer thickness of 0.1 to 8 μm, and more preferably so as to be a thickness of 6 to 8 μm after adding the overcoat layer to a resin pattern.

PVA having a partial saponification degree is also excellent in view of the fact that it is easy to remove the overcoat layer in the subsequent step (7). When the temperature of a bake process is set to be slightly lower, the overcoat layer is easily removed by washing with water.

<Heat-Treating Step (Step (6))>

The method for producing a resin pattern of the present invention includes (6) a heat-treating step (a bake step) of heat-treating the photosensitive resin composition on which the overcoat layer has been provided.

In the step of (6), a cured film can be formed by heat-treating the photosensitive resin composition on which the overcoat layer has been provided.

The temperature for heat-treating (The baking temperature) is preferably 180° C. to 250° C., and the time for heat-treating is preferably 30 to 150 minutes. In order to obtain a profile that is rectangular or close to a rectangle, it is preferable to perform so-called two-stage baking, by which heating is performed in two stages at different temperatures. The temperature for the first stage baking is preferably 90° C. to 150° C., and the time is preferably 10 to 60 minutes. The temperature for the second stage baking is preferably 180° C. to 210° C., and the time is preferably 30 to 90 minutes. Furthermore, a bake step of three or more stages can also be carried out.

<Removal Step (Step (7))>

The method for producing a resin pattern of the present invention includes (7) a removal step of removing the overcoat layer. This step removes the overcoat layer applied on the photosensitive resin composition heat-treated in the step (6). The solvent removal method is not limited, and includes a method such as a dry treatment (a dry etching), and a wet treatment (removing by dissolution in a treatment liquid). From the viewpoint of simplicity and a small effect on the photosensitive composition (the resin pattern), it is preferable to remove by dissolution in water, an aqueous alkali solution, or a solvent; more preferably in water and an aqueous alkali solution; and most preferably in water.

When it is removed by dissolution in a treatment liquid, a method such as a treatment of immersing the photosensitive composition in a treatment liquid, a treatment by showering in a liquid treatment, and a treatment (paddling) of placing a treatment liquid on a photosensitive resin composition, is included.

<Post-Heating Process>

After the step (7), the heating process may be provided again. This process may be effective for more complete curing of the film.

The taper angle for the cross-sectional shape of the pattern after the bake step is preferably 60° or greater, more preferably 70° or greater, and particularly preferably 80° or greater.

The "taper angle" is the angle formed by the lateral side of the pattern and the substrate plane on which the pattern is formed, in the cross-sectional shape obtained after forming a pattern and performing a heat-treating step. When the cross-sectional shape of the lateral side of the pattern is not straight, the angle formed between a straight line connecting an end of the lower surface of the pattern which is in contact with the substrate, with an end of the upper surface of the pattern, and the plane of the substrate is designated as the taper angle.

As a specific example, $\theta$ in the respective pattern cross-sectional shapes shown in FIG. 1 represents a taper angle.

In the example of Grade 5 of FIG. 1, since the pattern cross-sectional shape is arch-shaped, and the upper surface of the pattern is not recognized, the angle formed between a straight line connecting the apex of the arch, which is the remotest point on the arch from the substrate, and an end of the lower surface of the pattern that is in contact with the substrate, and the plane of the substrate, is designated as $\theta$.

A resin pattern having a profile that is rectangular or close to a rectangle can be obtained even after the heat treatment step, by the method for producing a resin pattern of the present invention. Therefore, the resin pattern obtained by the method for producing a resin pattern of the present invention (the resin pattern of the present invention) can be suitably used for a MEMS structure, an etching resist, a resist for forming a bump or a metal post and the like.

A rectangular pattern can be obtained without the exposure after development (the so-called post-exposure), by the method for producing a resin pattern of the present invention.

(MEMS Structure and Method for Production Thereof, and Image Display Apparatus)

The method for producing a MEMS (Micro Electro Mechanical System) structure of the present invention preferably includes two ways.

One is a MEMS structure produced by using a resin pattern produced by the method for producing a resin pattern of the present invention as a sacrificial layer at the time of lamination of the structure; and the other is a MEMS structure produced by using a resin pattern produced by the method for producing a resin pattern of the present invention as the MEMS structural component.

A MEMS (Micro Electro Mechanical System) refers to an electromechanical element or system having a microscopic structure having a size in the micrometer-scale, or a micromachine, and an example thereof may be a device in which a mechanical driving part, a sensor, an actuator, and an electronic circuit are integrated on a silicon substrate, a glass substrate or an organic material.

Furthermore, examples of the MEMS shutter device and the image forming apparatus including a MEMS shutter device include those described in JP-T-2008-533510.

(Method for Manufacturing a Semiconductor Device)

A method for manufacturing a semiconductor device of the present invention is a method manufacturing a semiconductor device such as an integrated circuit by etching a substrate using the resin pattern produced by the method for producing a resin pattern of the present invention as an etching resist. Since a method for manufacturing a semiconductor device of the present invention enables production of a rectangular resin pattern, the substrate to be etched can be clearly etched.

(Method for Producing a Plated Pattern)

The method for producing a plated pattern of the present invention is a method for producing the plated pattern plating the resin pattern produced by the method for producing a resin pattern of the present invention as a template. Since the method for producing a resin pattern of the present invention enables production of a rectangular resin pattern having a thick film thickness, plated patterns for a bump or a metal post can be suitably produced.

The bump refers to an electrode used in a case of connecting large-scale integration (LSI) and the like with electronic devices, and is described in detail in Japanese Patent No. 4544219.

(Photosensitive Resin Composition)

Hereinafter, the respective Components constituting the photosensitive resin composition will be described.

In regard to the description of a group (atomic group) according to the present specification, a description without the term substituted or unsubstituted is intended to include a group having no substituent, as well as a group having a substituent. For example, an "alkyl group" has a meaning of including an alkyl group which has no substituent (unsubstituted alkyl group) as well as an alkyl group having a substitute (substituted alkyl group).

The photosensitive composition used in the present invention is not particularly limited as long as it has photosensitivity and developability. It preferably has a property capable of being cured by heat. Among them, it is preferably any of the three embodiments shown below.

The first embodiment which is a preferable embodiment of the photosensitive resin composition is a photosensitive resin composition containing (Component A1) a polymer including a monomer unit (a1-1) having a residue of a carboxyl group or a phenolic hydroxyl group protected with an acid-decomposable group, and a monomer unit (a1-2) having an epoxy group and/or an oxetanyl group.

Component A1 preferably includes, in addition to the monomer units (a1-1) and (a1-2), a monomer unit (a1-3) having a cyclic structure, and/or a monomer unit (a1-4) having a carboxyl group or a hydroxyl group.

Component A1 may also include a monomer unit (a1-5) in addition to the monomer units (a1-1) to (a1-4).

The "monomer unit" according to the present invention is intended to include not only a constituent unit formed from one monomer molecule, but also a constituent unit obtained by modifying a constituent unit formed from one monomer molecule by a polymer reaction or the like.

The residue of a carboxyl group or a phenolic hydroxyl group protected with an acid-decomposable group can produce a carboxyl group or a phenolic hydroxyl group by decomposing (deprotecting) the acid-decomposable group with an acid.

(Component A1) Polymer Including a Monomer Unit (a1-1) and the Monomer Unit (a1-2)

The photosensitive resin composition preferably contains (Component A1) a polymer including a monomer unit (a1-1) having a residue of a carboxyl group or a phenolic hydroxyl group protected with an acid-decomposable group, and a monomer unit (a1-2) having an epoxy group and/or an oxetanyl group.

Component A1 is preferably a resin which is alkali-insoluble, and becomes alkali-soluble when the acid-decomposable group in the monomer unit (a1-1) is decomposed.

The term "alkali-soluble" according to the present invention means that a coating film (thickness 4 μm) of the compound (resin) formed when a solution of the compound (resin) is applied on a substrate and heated for 2 minutes at 90° C., has a dissolution rate in a 0.4 wt % aqueous solution of tetramethylammonium hydroxide at 23° C. of 0.01 μm/second or greater. The term "alkali-insoluble" means that a coating film (thickness 4 μm) of the compound (resin) formed when a solution of the compound (resin) is applied on a substrate and heated for 2 minutes at 90° C., has a dissolution rate in a 0.4 wt % aqueous solution of tetramethylammonium hydroxide at 23° C. of less than 0.01 μm/second, preferably less than 0.005 μm/second.

The weight average molecular weight (Mw) of Component A1 is preferably 5,000 or greater, more preferably 12,000 or greater, and yet more preferably 20,000 or greater, and is preferably 1,000,000 or less, more preferably 80,000 or less, and yet more preferably 60,000 or less. When the weight average molecular weight is 12,000 or greater, a profile having a satisfactory rectangular shape or a shape close to a rectangle can be obtained even after a bake step. Furthermore, when the weight average molecular weight is 80,000 or less, excellent pattern formability at the time of development is obtained.

Meanwhile, the weight average molecular weight is a value measured by gel permeation chromatography (GPC) and calculated relative to polystyrene standards. It is preferable to measure the weight average molecular weight using THF as a solvent, and using TSKgel SuperHZ3000 and TSKgel Super-HZM-M columns (all manufactured by Tosoh Corp.).

Component A1 is preferably an acrylic polymer.

The "acrylic polymer" according to the present invention is an addition polymerized resin, and is a polymer containing a monomer unit derived from (meth)acrylic acid or an ester thereof. The "acrylic polymer" may also have a monomer unit other than the monomer derived from (meth)acrylic acid or an ester thereof, for example, a monomer unit derived from a styrene or a monomer unit derived from a vinyl compound. Furthermore, Component A may also include a monomer unit derived from (meth)acrylic acid and a monomer unit derived from a (meth)acrylic acid ester together.

In the present specification, the "monomer unit derived from (meth)acrylic acid or an ester thereof" is also referred to as an "acrylic monomer unit." Furthermore, (meth)acrylic acid is meant to collectively refer to methacrylic acid and acrylic acid.

Hereinafter, various monomer units such as the monomer unit (a1-1) and the monomer unit (a1-2) will be described.

<Monomer Unit (a1-1) Having a Residue of a Carboxyl Group or a Phenolic Hydroxyl Group Protected with an Acid-Decomposable Group>

Component A has at least a monomer unit (a1-1) having a residue of a carboxyl group or a phenolic hydroxyl group protected with an acid-decomposable group.

When Component A has the monomer unit (a1-1), a photosensitive resin composition having very high sensitivity can be obtained. A monomer unit having a residue of a carboxyl group protected with an acid-decomposable group, is characterized in that development is rapidly achieved, as compared with a monomer unit having a residue of a phenolic hydroxyl group protected with an acid-decomposable group. Therefore, for development to be rapid, a monomer unit having a residue of a carboxyl group protected with an acid-decomposable group is preferable. On the contrary, for development to be delayed, it is preferable to use a monomer unit having a residue of a phenolic hydroxyl group protected with an acid-decomposable group. Monomer unit (a1-1-1) having residue of carboxyl group protected with acid-decomposable group —Monomer Unit Having Carboxyl Group—

A monomer unit having a carboxyl group may be, for example, a monomer unit derived from an unsaturated carboxylic acid having at least one carboxyl group in the molecule, such as an unsaturated monocarboxylic acid, an unsaturated dicarboxylic acid, or an unsaturated tricarboxylic acid.

Examples of the unsaturated carboxylic acid used to obtain the monomer unit having a carboxyl group include the acids described below. That is, examples of the unsaturated monocarboxylic acid include acrylic acid, methacrylic acid, crotonic acid, α-chloroacrylic acid, and cinnamic acid. Examples of the unsaturated dicarboxylic acid include maleic acid, fumaric acid, itaconic acid, citraconic acid, and mesaconic acid. Furthermore, the unsaturated polyvalent carboxylic acid used to obtain the monomer unit having a carboxyl group may also be in the form of an acid anhydride thereof. Specific examples include maleic anhydride, itaconic anhydride, and citraconic anhydride. Furthermore, the unsaturated polyvalent carboxylic acid may be a mono(2-methacryloyloxyalkyl) ester of a polyvalent carboxylic acid, and examples include mono(2-acryloyloxyethyl)succinate, mono(2-methacryloyloxyethyl)succinate, mono(2-acryloyloxyethyl)phthalate, and mono(2-methacryloyloxyethyl)phthalate.

Furthermore, the unsaturated polyvalent carboxylic acid may be a mono(meth)acrylate of a dicarboxypolymer having the unsaturated polyvalent carboxylic acid at the two ends, and examples thereof include ω-carboxypolycaprolactone monoacrylate, and ω-carboxypolycaprolactone monomethacrylate.

As the unsaturated carboxylic acid, acrylic acid-2-carboxyethyl ester, methacrylic acid-2-carboxyethyl ester, maleic acid monoalkyl ester, fumaric acid monoalkyl ester, 4-carboxystyrene and the like can also be used.

Among them, from the viewpoint of developability, it is preferable to use acrylic acid, methacrylic acid, or an anhydride of an unsaturated polyvalent carboxylic acid in order to form the monomer unit having a carboxyl group, and it is more preferable to use acrylic acid or methacrylic acid.

The monomer unit having a carboxyl group may be composed of one kind only, or may be composed of two or more kinds.

The monomer unit having a carboxyl group may be a monomer unit obtained by allowing a monomer unit having a hydroxyl group to react with an acid anhydride.

As the acid anhydride, known compounds may be used, and specific examples include dibasic acid anhydrides such as maleic anhydride, succinic anhydride, itaconic anhydride, phthalic anhydride, tetrahydrophthalic anhydride, hexahydrophthalic anhydride, and chlorendic anhydride; and acid anhydrides such as trimellitic anhydride, pyromellitic anhydride, benzophenonetetracarboxylic acid anhydride, and biphenyltetracarboxylic acid anhydride. Among these, from the viewpoint of developability, phthalic anhydride, tetrahydrophthalic anhydride, and succinic anhydride are preferable.

The reaction ratio of the acid anhydride with respect to the hydroxyl group is preferably 10 to 100 mol %, and more preferably 30 to 100 mol %, from the viewpoint of developability.

—(a1-1-1) Monomer Unit Having a Residue of a Carboxyl Group Protected with an Acid-Decomposable Group—

The monomer unit (a1-1-1) having a residue of a carboxyl group protected with an acid-decomposable group is preferably a monomer unit in which the carboxyl group of the monomer unit having a carboxyl group has a residue protected by an acid-decomposable group that will be described in detail below.

As the acid-decomposable group, groups hitherto known as acid-decomposable groups for positive resist for KrF and positive resist for ArF can be used, and there are no particular limitations thereon. Conventionally, a group that can be relatively easily decomposed by an acid (for example, an acetal-based functional group such as a tetrahydropyranyl group) and a group which cannot be relatively easily decomposed by an acid (for example, a t-butyl-based functional group such as a t-butyl ester group or a t-butyl carbonate group) are known.

Among these acid-decomposable groups, a monomer unit in which the acid-decomposable group is a residue in which a carboxyl group is protected with an acetal, or is a residue in which a carboxyl group protected with a ketal, is preferable from the viewpoints of the fundamental properties of the resist, particularly sensitivity, pattern shape, contact hole formability, and storage stability of the photosensitive resin composition. Furthermore, among the acid-decomposable groups, it is more preferable, from the viewpoint of sensitivity, that the monomer unit have a residue in which a carboxyl group is protected with an acetal or ketal represented by the following formula (a1-1). Meanwhile, in the case of a residue in which a carboxyl group is protected with an acetal or ketal represented by the following formula (a1-1), the residue has an overall structure of —C(=O)—O—CR$^1$R$^2$(OR$^3$).

(a1-1)

(In the formula (a1-1), R$^1$ and R$^2$ each independently represent a hydrogen atom or an alkyl group, provided that the case where R$^1$ and R$^2$ are both hydrogen atoms is excluded; R$^3$ represents an alkyl group; R$^1$ or R$^2$ and R$^3$ may be joined to form a cyclic ether; and the wavy line represents the position of bonding to another structure.)

In the formula (a1-1), R$^1$ to R$^3$ each independently represent a hydrogen atom or an alkyl group, and the alkyl group may be either linear, branched or cyclic. Here, it is not necessary that both of R$^1$ and R$^2$ represent hydrogen atoms, and at least one of R$^1$ and R$^2$ represents an alkyl group.

In the formula (a1-1), when R$^1$, R$^2$ and R$^3$ represent alkyl groups, the alkyl group may be either linear, branched or cyclic.

The linear or branched alkyl group preferably has 1 to 12 carbon atoms, more preferably 1 to 6 carbon atoms, and yet more preferably 1 to 4 carbon atoms. Specific examples include a methyl group, an ethyl group, a n-propyl group, an i-propyl group, a n-butyl group, an i-butyl group, a sec-butyl group, a t-butyl group, a n-pentyl group, a neopentyl group, a n-hexyl group, a thexyl group (2,3-dimethyl-2-butyl group), a n-heptyl group, a n-octyl group, a 2-ethylhexyl group, a n-nonyl group, and a n-decyl group.

The cyclic alkyl group preferably has 3 to 12 carbon atoms, more preferably 4 to 8 carbon atoms, and yet more preferably 4 to 6 carbon atoms. Examples of the cyclic alkyl group include a cyclopropyl group, a cyclobutyl group, a cyclopentyl group, a cyclohexyl group, a cycloheptyl group, a cyclooctyl group, a norbornyl group, and an isobornyl group.

The alkyl group may be substituted with a substituent, and examples of the substituent include a halogen atom, an aryl group, and an alkoxy group. When the alkyl group has a halogen atom as the substituent, R$^1$, R$^2$ and R$^3$ becomes haloalkyl groups, and when the alkyl group has an aryl group as the substituent, R$^1$, R$^2$ and R$^3$ become aralkyl groups.

Examples of the halogen atom include a fluorine atom, a chlorine atom, a bromine atom, and an iodine atom, and among these, a fluorine atom and a chlorine atom are preferable.

The aryl group is preferably an aryl group having 6 to 20 carbon atoms, and more preferably an aryl group having 6 to 12 carbon atoms. Specific examples include a phenyl group, an α-methylphenyl group, and a naphthyl group.

The aralkyl group is preferably an aralkyl group having 7 to 32 carbon atoms, and more preferably an aralkyl group having 7 to 20 carbon atoms. Specific examples include a benzyl group, an α-methylphenyl group, a phenethyl group, and a naphthylmethyl group.

The alkoxy group is preferably an alkoxy group having 1 to 6 carbon atoms, and more preferably an alkoxy group having 1 to 4 carbon atoms. A methoxy group or an ethoxy group is yet more preferable.

When the alkyl group is a cycloalkyl group, the cycloalkyl group may have a linear or branched alkyl group having 1 to 10 carbon atoms as a substituent, and when the alkyl group is a linear or branched alkyl group, the group may have a cycloalkyl group having 3 to 12 carbon atoms as a substituent.

These substituents may be further substituted with the substituents described above.

In the formula (a1-1), when R$^1$, R$^2$ and R$^3$ represent aryl groups, the aryl group preferably has 6 to 12 carbon atoms, and more preferably has 6 to 10 carbon atoms. The aryl group may be substituted with a substituent, and a preferable example of the substituent is an alkyl group having 1 to 6 carbon atoms. Examples of the aryl group include a phenyl group, a tolyl group, a silyl group, a cumenyl group, and a 1-naphthyl group.

Furthermore, R$^1$, R$^2$ and R$^3$ may be joined to each other and may form a ring together with the carbon atoms to which they are bonded. Examples of the cyclic structure that can be formed when R$^1$ and R$^2$, R$^1$ and R$^3$, or R$^2$ and R$^3$ are joined, include a cyclobutyl group, a cyclopentyl group, a cyclohexyl group, a cycloheptyl group, a tetrahydrofuranyl group, an adamantyl group, and a tetrahydropyranyl group. Among them, a tetrahydrofuranyl group is preferable.

In the formula (a1-1), it is preferable that any one of R$^1$ and R$^2$ be a hydrogen atom or a methyl group.

For the radical polymerizable monomer used to form the monomer unit having a residue represented by the formula (a1-1), a commercially available compound may be used, or a product synthesized by a known method may also be used. For example, as shown below, the monomer can be synthesized by allowing (meth)acrylic acid to react with a vinyl ether in the presence of an acid catalyst.

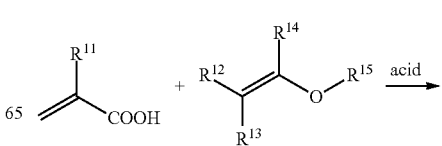

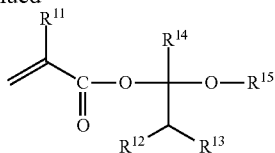

$R^{11}$ represents a hydrogen atom or an alkyl group, and is preferably a hydrogen atom or a methyl group.

$R^{12}$ and $R^{13}$, as in the form of —CH($R^{12}$)($R^{13}$), have the same meaning as $R^2$ defined for the formula (a1-1), and $R^{14}$ has the same meaning as $R^1$ defined for the formula (a1-1). $R^{15}$ has the same meaning as $R^3$ defined for the formula (a1-1), and these substituents also have the same preferable ranges as $R^1$, $R^2$ and $R^3$.

The above-mentioned synthesis may be carried out by copolymerizing (meth)acrylic acid with the other monomer in advance, and then allowing the product to react with a vinyl ether in the presence of an acid catalyst.

Specific preferable examples of the monomer unit (a1-1-1) having a residue of a carboxyl group protected with an acid-decomposable group include the following monomer units. R represents a hydrogen atom or a methyl group.

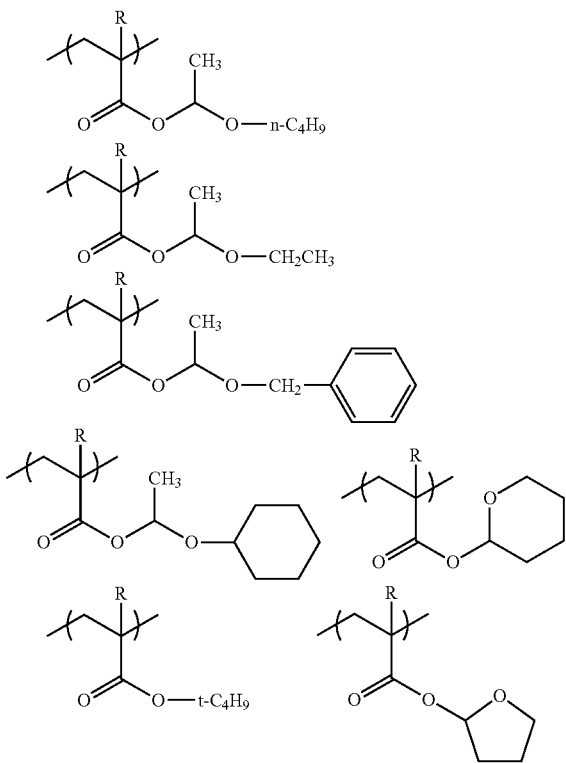

Monomer Unit (a1-1-2) Having Residue of Phenolic Hydroxyl Group Protected with Acid-Decomposable Group
—Monomer Unit Having Phenolic Hydroxyl Group—

Examples of a monomer unit having a phenolic hydroxyl group include a hydroxystyrene-based monomer unit and a monomer unit found in a novolac-based resin. Among the monomer units having a phenolic hydroxyl group, a monomer represented by formula (a1-2) is preferable from the viewpoint of transparency and sensitivity.

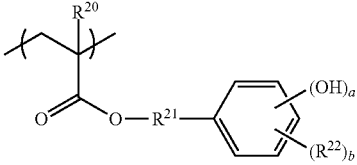

(In the formula (a1-2), $R^{20}$ represents a hydrogen atom or a methyl group; $R^{21}$ represents a single bond or a divalent linking group; $R^{22}$ represents a halogen atom or an alkyl group; a represents an integer from 1 to 5, b represents an integer from 1 to 4, while a+b is 5 or less; and when there are two or more of $R^{22}$, these $R^{22}$'s may be different or may be identical.)

In the formula (a1-2), $R^{20}$ represents a hydrogen atom or a methyl group, and is preferably a methyl group.

Furthermore, $R^{21}$ in the formula (a1-2) represents a single bond or a divalent linking group. In the case of a single bond, it is preferable because sensitivity can be increased, and the transparency of the cured film can be increased. The divalent linking group of $R^{21}$ may be an alkylene group, and specific examples of the alkylene group as $R^{21}$ include a methylene group, an ethylene group, a propylene group, an isopropylene group, an n-butylene group, an isobutylene group, a tert-butylene group, a pentylene group, an isopentylene group, a neopentylene group, and a hexylene group. Among these, it is preferable that $R^{21}$ be a single bond, a methylene group or an ethylene group. Furthermore, the divalent linking group may be substituted with a substituent, and examples of the substituent include a halogen atom, a hydroxyl group, and an alkoxy group.

Furthermore, a in the formula (a1-2) represents an integer from 1 to 5, but from the viewpoints of the effect of the present invention or facilitated production, a is preferably 1 or 2, and a is more preferably 1.

The position of bonding of the hydroxyl group in the benzene ring is preferably such that $R^{21}$ is bonded at the 4-position when the carbon atom bonded to $R^{21}$ is taken as the reference position (1-position).

$R^{22}$ in the formula (a1-2) represents a halogen atom, or a linear or branched alkyl group having 1 to 5 carbon atoms. Specific examples include a fluorine atom, a chlorine atom, a bromine atom, a methyl group, an ethyl group, a propyl group, an isopropyl group, a n-butyl group, an isobutyl group, a tert-butyl group, a pentyl group, an isopentyl group, and a neopentyl group. Among them, from the viewpoint that production is easy, $R^{22}$ is preferably a chlorine atom, a bromine atom, a methyl group or an ethyl group.

Also, b represents 0 or an integer from 1 to 4.

Among the monomer units having a phenolic hydroxyl group, when $R^{21}$ in the formula (a1-2) is not an alkylene group, a monomer unit represented by the formula (a1-2') is more preferable from the viewpoints of transparency and sensitivity. Preferable examples of the linking group of $R^{21}$ include, in addition to an alkylene group, an alkyleneoxycarbonyl group (from the side of the main chain of the copolymer). In this case, it is preferable that the monomer unit having a phenolic hydroxyl group be represented by the following formula (a1-2').

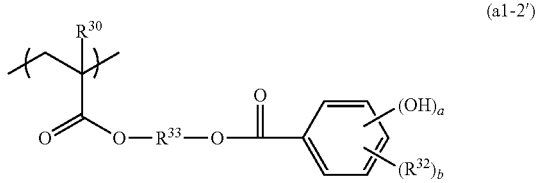

(a1-2')

(In the formula (a1-2'), $R^{30}$ represents a hydrogen atom or a methyl group; $R^{33}$ represents a divalent linking group; $R^{32}$ represents a halogen atom or an alkyl group; a represents an integer from 1 to 5; b represents an integer from 0 to 4, while a+b is 5 or less; and when there are two or more $R^{32}$'s, these $R^{32}$'s may be identical with or different from each other.)

In the formula (a1-2'), $R^{30}$ has the same meaning as $R^{20}$ in the formula (a1-2), $R^{32}$ has the same meaning as $R^{22}$ in the formula (a1-2), and a and b respectively have the same meanings as a and b in the formula (a1-2). They also have the same preferable ranges.

In the formula (a1-2'), $R^{33}$ represents a divalent linking group, and a preferable example may be an alkylene group. The alkylene group may be either a linear group or a branched group, and preferably has 2 to 6 carbon atoms. Examples thereof include an ethylene group, a propylene group, an isopropylene group, an n-butylene group, a tert-butylene group, a pentylene group, an isopentylene group, a neopentylene group, and a hexylene group. The divalent linking group may be substituted with a substituent, and examples of the substituent include a halogen atom, a hydroxyl group, and an alkoxy group. Among these, $R^{33}$ is preferably an ethylene group, a propylene group, or a 2-hydroxypropylene group, from the viewpoint of sensitivity.

—Monomer Unit (a1-1-2) Having Residue of Phenolic Hydroxyl Group Protected with Acid-Decomposable Group—

The monomer unit having a residue of a phenolic hydroxyl group protected with an acid-decomposable group, is a monomer unit having a residue in which the phenolic hydroxyl group of the monomer unit having a phenolic hydroxyl group is protected by the acid-decomposable group that will be described in detail below.

As the acid-decomposable group, those groups that are well known can be used as previously described, and there are no particular limitations. Among the acid-decomposable group, a monomer unit having a residue of a phenolic hydroxyl group protected with an acetal, or a residue of a phenolic hydroxyl group protected with a ketal, is preferable from the viewpoints of the fundamental properties of the resist, particularly sensitivity, pattern shape, storage stability of the photosensitive resin composition, and contact hole formability. Furthermore, among the acid-decomposable groups, a residue in which a phenolic hydroxyl group is protected with an acetal or ketal represented by the formula (a1-1) is more preferable from the viewpoint of sensitivity. When the phenolic hydroxyl group is a residue protected with the acetal or ketal represented by the formula (a1-1), the overall structure of the residue is —Ar—O—$CR^1R^2(OR^3)$. Here, Ar represents an arylene group.

Preferable examples of an acetal ester structure protecting the phenolic hydroxyl group include a combination of $R^1$, $R^2$ and $R^3$ each being a methyl group, and a combination of $R^1$ and $R^2$ each being a methyl group and $R^3$ being a benzyl group.

Examples of radical polymerizable monomers used to form the monomer unit having a residue of a phenolic hydroxyl group protected with an acetal or a ketal, include a 1-alkoxyalkyl-protected product of hydroxystyrene, a tetrahydropyranyl-protected product of hydroxystyrene, a 1-alkoxyalkyl-protected product of α-methylhydroxystyrene, a tetrahydropyranyl-protected product of α-methylhydroxystyrene, a 1-alkoxyalkyl-protected product of 4-hydroxyphenyl methacrylate, a tetrahydropyranyl-protected product of 4-hydroxyphenyl methacrylate, a 1-alkoxyaklyl-protected product of 4-hydroxybenzoic acid (1-methacryloyloxymethyl)ester, a tetrahydropyranyl-protected product of 4-hydroxybenzoic acid (1-methacryloyloxymethyl)ester, a 1-alkoxyalkyl-protected product of 4-hydroxybenzoic acid (2-methacryloyloxyethyl)ester, a tetrahydropyranyl-protected product of 4-hydroxybenzoic acid (2-methacryloyloxyethyl)ester, a 1-alkoxyalkyl-protected product of 4-hydroxybenzoic acid (3-methacryloyloxypropyl)ester, a tetrahydropyranyl-protected product of 4-hydroxybenzoic acid (3-methacryloyloxypropyl)ester, a 1-alkoxyalkyl-protected product of 4-hydroxybenzoic acid (3-methacryloyloxy-2-hydroxypropyl)ester, and a tetrahydropyranyl-protected product of 4-hydroxybenzoic acid (3-methacryloyloxy-2-hydroxypropyl)ester.

The acetal protective group and the ketal protective group for the phenolic hydroxyl group are preferably a group represented by the formula (a1-1). These can be used singly or in combination of two or more kinds.

Preferable specific examples of the monomer unit (a1-1-2) include the following monomer units, but the present invention is not limited to these examples. R in the following monomer units represents a hydrogen atom or a methyl group.

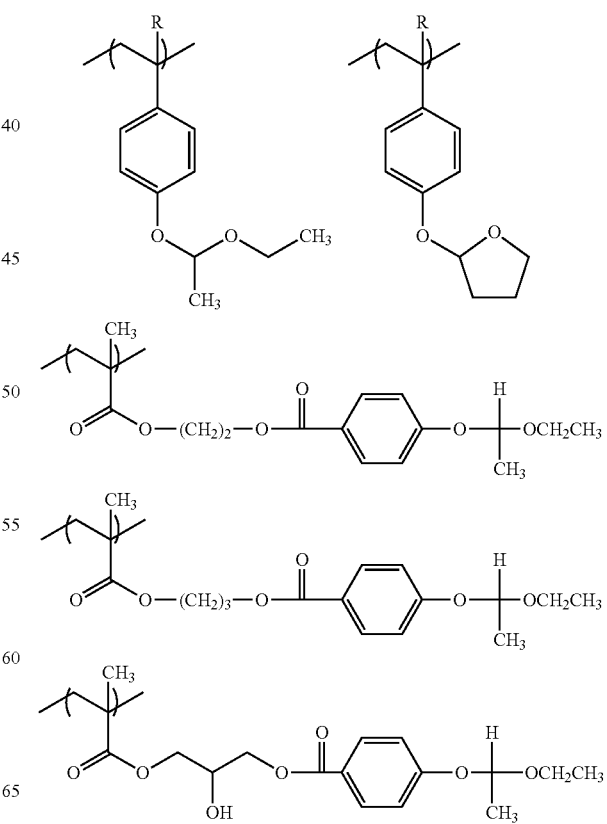

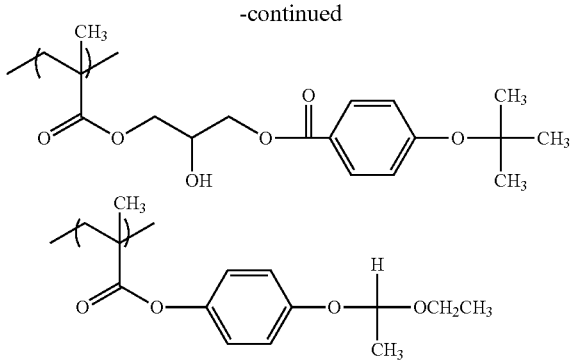

The content of the monomer unit (a1-1) in Component A1 is preferably 3 to 70 mol %, more preferably 5 to 60 mol %, and yet more preferably 10 to 50 mol %, based on all the monomer units of Component A1. On the other hand, the content of the monomer unit (a1-1) is preferably 45 mol % or less, in view of deterioration of the profile due to deprotection shrinkage, and is particularly preferably in the range of 10 to 45 mol % in view of a balance between sensitivity and rectangle formability.

<Monomer Unit (a1-2) Having Epoxy Group and/or Oxetanyl Group>

Component A1 has a monomer unit (a1-2) having an epoxy group and/or an oxetanyl group. Component A1 may have both of a monomer unit having an epoxy group and a monomer unit having an oxetanyl group.

The group having an epoxy group is not particularly limited as long as it has an epoxy ring, but preferable examples include a glycidyl group, and a 3,4-epoxycyclohexylmethyl group.

The group having an oxetanyl group is not particularly limited as long as it has an oxetane ring, and a preferable example may be a (3-ethyloxetan-3-yl)methyl group.

The monomer unit (a1-2) may have at least one epoxy group or oxetanyl group in one monomer unit, and may also have one or more epoxy groups and one or more oxetanyl group, two or more epoxy groups, or two or more oxetanyl groups. There are no particular limitations, but the monomer unit (a1-2) preferably has one to three epoxy groups and/or oxetanyl groups in total, more preferably has one or two epoxy groups and/or oxetanyl groups in total, and yet more preferably has one epoxy group or one oxetanyl group.

Specific examples of the radical polymerizable monomer used to form the monomer unit having an epoxy group include glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, o-vinylbenzyl glycidyl ether, m-vinylbenzyl glycidyl ether, p-vinylbenzyl glycidyl ether, and the compound containing an alicyclic epoxy skeleton described in paragraphs 0031 to 0035 of Japanese Patent No. 4168443.

Examples of the radical polymerizable monomer used to form the monomer unit having an oxetanyl group include the (meth)acrylic acid esters having an oxetanyl group described in paragraphs 0011 to 0016 of JP-A-2001-330953.

Preferable examples of the radical polymerizable monomer used to form the monomer unit (a1-2) include a monomer containing a methacrylic acid ester structure, and a monomer containing an acrylic acid ester structure.

Among these monomers, more preferable examples include glycidyl methacrylate, glycidyl acrylate, a compound containing an alicyclic epoxy skeleton as described in paragraphs 0034 to 0035 of Japanese Patent No. 4168443, and a (meth)acrylic acid ester having an oxetanyl group as described in paragraphs 0011 to 0016 of JP-A-2001-330953.

A particularly preferable example, from the viewpoint of heat resistance and transparency, is a monomer unit derived from any one of (3-ethyloxetan-3-yl)methyl acrylate and (3-ethyloxetan-3-yl)methyl methacrylate.

These monomer units (a1-2) can be used singly or in combination of two or more kinds.

Specific preferable examples of the monomer unit (a1-2) include the following monomer units.

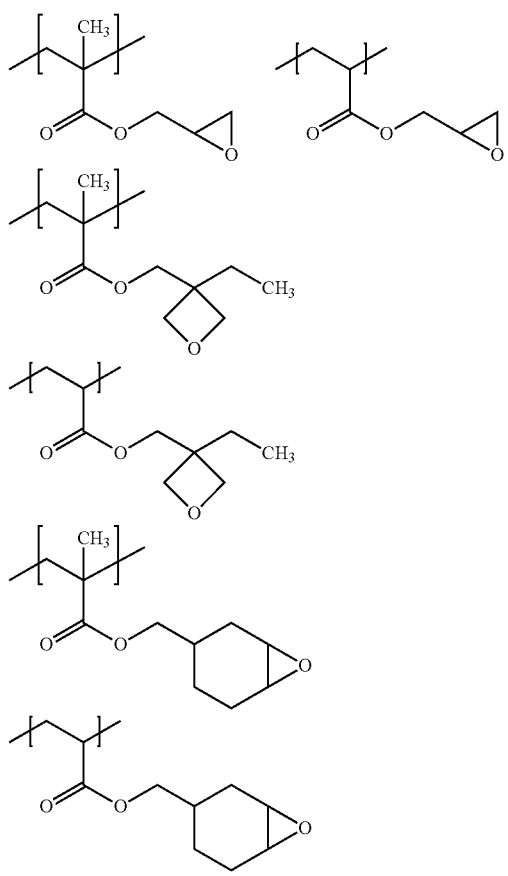

The content of the monomer unit (a1-2) in Component A1 is preferably 20 to 55 mol %, more preferably 25 to 55 mol %, and particularly preferably 25 to 50 mol %, based on all the monomer units of Component A1. When the monomer unit (a1-2) is incorporated at the above-described proportion, the properties of the cured film become satisfactory.

<Monomer Unit (a1-3) Having Cyclic Structure>

Component A1 preferably contains a monomer unit (a1-3) having a cyclic structure, from the viewpoint of enhancing dry etching resistance or chemical resistance.

Examples of the monomer forming the monomer unit (a1-3) include (meth)acrylic acid cyclic alkyl esters such as styrenes, dicyclopentanyl (meth)acrylate, cyclohexyl (meth)acrylate, and cyclohexyl (meth)acrylate; and unsaturated aromatic compounds.

A preferable example of the monomer unit (a1-3) having a cyclic structure may be a monomer unit represented by the following formula (a3-1) or formula (a3-2).

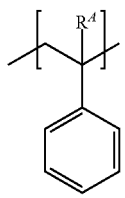

(a3-1)

(In the formula, $R^A$ represents a hydrogen atom or an alkyl group having 1 to 6 carbon atoms.)

$R^A$ in the formula (a3-1) is preferably a hydrogen atom or a methyl group, and particularly preferably a hydrogen atom, from the viewpoint of the uniformity of polymerization rate of each monomer at the time of polymerization.

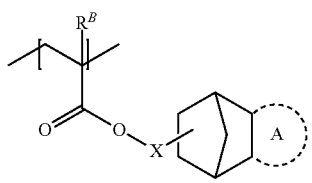

(a3-2)

(In the formula, $R^B$ represents a hydrogen atom or a methyl group; X represents a single bond or an alkylene group having 1 to 4 carbon atoms; ring A represents a cyclopentane ring or a cyclopentene ring; and the structure may or may not have the ring A.)

$R^B$ in the formula (a3-2) is preferably a methyl group from the viewpoint of the uniformity of the polymerization rate of each monomer at the time of polymerization.

X in the formula (a3-2) is preferably a single bond, a methylene group or an ethylene group, and more preferably a single bond.

The ring A in the formula (a3-2) is preferably a cyclopentane ring.

It is preferable that the formula (a3-2) have the ring A. The position of the double bond of a cyclopentene ring for the ring A is not particularly limited, and any position may be acceptable.

The content of the monomer unit (a1-3) in Component A1 is preferably 1 to 30 mol %, more preferably 5 to 25 mol %, and particularly preferably 10 to 20 mol %, based on all the monomer units of Component A1. When the monomer unit (a1-3) is incorporated at the above-described proportion, the resulting pattern has excellent dry etching resistance and chemical resistance.

<Monomer Unit (a1-4) Having Carboxyl Group or Hydroxyl Group>

Component A1 preferably has a monomer unit (a1-4) having a carboxyl group or a hydroxyl group, from the viewpoint of developability.

The monomer unit (a1-4) is preferably introduced to the extent that Component A1 does not become alkali-soluble. The content of the monomer unit (a1-4) in Component A1 is preferably 2 to 20 mol %, more preferably 2 to 15 mol %, and particularly preferably 3 to 15 mol %, based on all the monomer units of Component A1. When the monomer unit (a1-4) is incorporated at the above-described proportion, high sensitivity is obtained, and developability is improved.

Monomer Unit Having a Carboxyl Group (a1-4-1)

As the monomer unit (a1-4-1) having a carboxyl group, the same unit as the "monomer unit having a carboxyl group" described in the monomer unit (a1-1-2) having a residue of a carboxyl group protected with an acid-decomposable group, can be used.

Among them, from the viewpoint of developability, it is preferable to use acrylic acid or methacrylic acid in order to form the monomer unit (a1-4-1) having a carboxyl group.

Monomer Unit Having a Phenolic Hydroxyl Group (a1-4-2)

An example of the monomer unit (a1-4) having a hydroxyl group may be a monomer unit (a1-4-2) having a phenolic hydroxyl group.

Preferable examples of a radical polymerizable monomer used to form a monomer unit (a1-4-2) having a phenolic hydroxyl group include hydroxystyrenes such as p-hydroxystyrene and α-methyl-p-hydroxystyrene; the compounds described in paragraphs 0011 to 0016 of JP-A-2008-40183; the 4-hydroxybenzoic acid derivatives described in paragraphs 0007 to 0010 of Japanese Patent No. 2888454; addition reaction products of 4-hydroxybenzoic acid and glycidyl methacrylate; and addition reaction products of 4-hydroxybenzoic acid and glycidyl acrylate.

Among the radical polymerizable monomers used to form the monomer unit (a1-4-2) having a phenolic hydroxyl group, methacrylic acid, acrylic acid; the compounds described in paragraphs 0011 to 0016 of JP-A-2008-40183; the 4-hydroxybenzoic acid derivatives described in paragraphs 0007 to 0010 of Japanese Patent No. 2888454; addition reaction products of 4-hydroxybenzoic acid and glycidyl methacrylate; and addition reaction products of 4-hydroxybenzoic acid and glycidyl acrylate are more preferable. However, from the viewpoint of transparency, methacrylic acid and acrylic acid are particularly preferable. These monomer units can be used singly or in combination of two or more kinds.

Monomer Unit Having a Hydroxyl Group Other than a Phenolic Hydroxyl Group (a1-4-3)

Any monomer unit having a hydroxyl group can be used as the monomer unit (a1-4-3) having a hydroxyl group other than a phenolic hydroxyl group, but preferable examples include monomer units derived from a hydroxyl group-containing (meth)acrylic acid ester, a (meth)acrylic acid ester of an alkyl group-terminated polyalkylene glycol, and a (meth)acrylic acid ester of an aryl group-terminated polyalkylene glycol.

Preferable examples of the hydroxyl group-containing (meth)acrylic acid ester include (meth)acrylic acid hydroxyalkyl esters such as 2-hydroxyethyl acrylate, 2-hydroxypropyl(meth)acrylate, 3-hydroxypropyl(meth)acrylate, 2,3-dihydroxypropyl (meth)acrylate, and 4-hydroxybutyl(meth)acrylate; polyethylene glycol mono(meth)acrylate, polypropylene glycol mono(meth)acrylate, poly(ethylene glycol-propylene glycol)mono(meth)acrylate, polyethylene glycol-polyproylene glycol mono(meth)acrylate, poly(ethylene glycol-tetramethylene glycol)mono(meth)acrylate, poly (propylene glycol-tetramethylene glycol)mono(meth)acrylate, and propylene glycol-polybutylene glycol mono(meth) acrylate.

Preferable examples of the (meth)acrylic acid ester of alkyl group-terminated polyalkylene glycol include methoxypolyethylene glycol(meth)acrylate, octoxypolyethylene glycol polypropylene glycol(meth)acrylate, lauroxypolyethylene glycol(meth)acrylate, and stearoxypolyethylene glycol (meth)acrylate.

Preferable examples of the (meth)acrylic acid ester of aryl group-terminated polyalkylene glycol include phenoxypolyethylene glycol(meth)acrylate, phenoxypolyethylene glycol-polypropylene glycol(meth)acrylate, nonylphenoxy-polyethylene glycol(meth)acrylate, nonylphenoxy-polypropylene glycol(meth)acrylate, and nonylphenoxy-poly(ethylene glycol-propylene glycol)(meth)acrylate.

The number of hydroxyl groups in the monomer unit (a1-4-3) is preferably 1 to 30, more preferably 1 to 15, and particularly preferably 1 to 5.

The monomer unit (a1-4) can be used singly or in combination of two or more kinds.

The content of the monomer unit (a1-4) in Component A1 is preferably 0.5 to 30 mol %, more preferably 0.5 to 25 mol %, and particularly preferably 1 to 25 mol %, based on all the monomer units of Component A1.

Furthermore, the content of the monomer unit (a1-4) in Component A1 is preferably 3 to 30 wt %, more preferably 3 to 25 wt %, and particularly preferably 5 to 25 wt %, based on the total weight of Component A1. When the monomer unit (a1-4) is incorporated at the above-described proportion, developability is improved, and a photosensitive composition having high sensitivity can be obtained. Particularly, when the monomer unit (a1-2) described above and the monomer unit (a1-4) are combined, a photosensitive resin composition having very high sensitivity can be obtained.

<Other Monomer Unit (a1-5)>

Component A1 may include a monomer unit (a1-5) other than the monomer units (a1-1) to (a1-4), to the extent that the effect of the present invention is not impaired.

Examples of the radical polymerizable monomer used to form the monomer unit (a1-5) include the compounds described in paragraphs 0021 to 0024 of JP-A-2004-264623 (provided that the monomers forming the monomer units (a1-1) to (a1-4) are excluded).

Component A1 may have only one kind of the monomer unit (a1-5), or may have two or more kinds of the monomer unit (a1-5).

The content of the monomer unit (a1-5) in Component A1 is preferably 0 to 40 mol % based on all the monomer units of Component A1.

When Component A1 includes the monomer unit (a1-5), the content of the monomer unit (a1-5) in Component A1 is preferably 1 to 40 mol %, more preferably 5 to 30 mol %, and particularly preferably 5 to 25 mol %, based on all the monomer units of Component A1.

The weight average molecular weight according to the present invention is a weight average molecular weight measured by gel permeation chromatography (GPC) and calculated relative to polystyrene standards.

The method of introducing the various monomer units of Component A1 may be a polymerization method or may be a polymer reaction method, and these two methods may also be used in combination.

Component A1 can be used singly or in combination of two or more kinds, in the photosensitive resin composition.

The content of Component A1 in the photosensitive resin composition is preferably 20 to 99 wt %, more preferably 40 to 97 wt %, and yet more preferably 60 to 95 wt %, based on the total solids content of the photosensitive resin composition. When the content is in this range, pattern formability is improved when the pattern is developed. The solids content of the photosensitive resin composition herein means the amount of Components excluding volatile Components such as solvent.

Furthermore, in the photosensitive resin composition, a resin other than Component A1 may be used in combination to the extent that the effect of the present invention is not impaired. However, the content of the resin other than Component A1 is preferably smaller than the content of Component A1 from the viewpoint of developability.

(Component B1) Photo Acid Generator

The photosensitive resin composition contains (Component B1) a photo acid generator.

Component B1 is preferably a compound which generates an acid in response to an active radiation having a wavelength of 300 nm or greater, and preferably a wavelength of 300 to 450 nm, but there are no limitations on the chemical structure. Furthermore, even in the case of a photo acid generator which does not directly respond to an active radiation having a wavelength of 300 nm or greater, a compound which generates an acid in response to an active radiation having a wavelength of 300 nm or greater when used together with a sensitizer, can be preferably used in combination with a sensitizer.

Component B1 is preferably a photo acid generator which generates an acid having a pKa of 4 or lower, and more preferably a photo acid generator which generates an acid having a pKa of 3 or lower.

Examples of the photo acid generator include trichloromethyl-s-triazines, sulfonium salts or iodonium salts, quaternary ammonium salts, diazomethane compounds, imidosulfonate compounds, and oxime sulfonate compounds. Among these, it is preferable to use oxime sulfonate compounds from the viewpoint of having high sensitivity. These photo acid generators can be used singly or in combination of two or more kinds.

Specific examples thereof include the following compounds.

As trichloromethyl-s-triazines, 2-(3-chlorophenyl)bis(4,6-trichloromethyl)-s-triazine, 2-(4-methoxyphenyl)bis(4,6-trichloromethyl)-s-triazine, 2-(4-methylthiophenyl)bis(4,6-trichloromethyl)-s-triazine, 2-(4-methoxy-β-styryl)bis(4,6-trichloromethyl)-s-triazine, 2-piperonylbis(4,6-trichloromethyl)-s-triazine, 2-[2-(furan-2-yl)ethenyl]bis(4,6-trichloromethyl)-s-triazine, 2-[2-(5-methylfuran-2-yl)ethenyl]bis(4,6-trichloromethyl)-s-triazine, 2-[2-(4-diethylamino-2-methylphenyl)ethenyl]bis(4,6-trichloromethyl)-s-triazine, and 2-(4-methoxynaphthyl)bis(4,6-trichloromethyl)-s-triazine;

as diaryliodonium salts, diphenyliodonium trifluoroacetate, diphenyliodonium trifluoromethanesulfonate, 4-methoxyphenylphenyliodonium trifluoromethanesulfonate, 4-methoxyphenylphenyliodonium trifluoroacetate, phenyl-4-(2'-hydroxy-1'-tetradecaoxy)phenyliodonium trifluoromethanesulfonate, 4-(2'-hydroxy-1'-tetradecaoxy)phenyliodonium hexafluoroantimonate, and phenyl-4-(2'-hydroxy-1'-tetradecaoxy)phenyliodonium p-toluenesulfonate;

as triarylsulfonium salts, triphenylsulfonium trifluoromethanesulfonate, triphenylsulfonium trifluoroacetate, 4-methoxyphenyldiphenylsulfonium trifluoromethanesulfonate, 4-methoxyphenyldiphenylsulfonium trifluoroacetate, 4-phenylthiophenyldiphenylsulfonium trifluoromethanesulfonate, and 4-phenylthiophenyldiphenylsulfonium trifluoroacetate;

as quaternary ammonium salts, tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate, and benzyldimethylphenylammonium hexyltris(3-trifluoromethylphenyl)borate;

as diazomethane derivatives, bis(cyclohexylsulfonyl)diazomethane, bis(t-butylsulfonyl)diazomethane, and bis(p-toluenesulfonyl)diazomethane; and as imidosulfonate derivatives, trifluoromethylsulfonyloxybicyclo[2.2.1]hept-5-enedicarboxylimide, succinimidotrifluoromethyl sulfonate, phthalimidotrifluoromethyl sulfonate, N-hydroxynaphthalimidomethane sulfonate, and N-hydroxy-5-norbornene-2,3-dicarboxylimidopropane sulfonate.

The photosensitive resin composition preferably contains, as (Component B1) photo acid generator, an oxime sulfonate compound having at least one oxime sulfonate residue represented by the following formula (1). Meanwhile, the wavy line represents the position of bonding to another chemical structure.

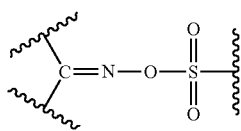
(1)

The oxime sulfonate compound having at least one oxime sulfonate residue represented by the above formula (1) is preferably a compound represented by the following formula (2).

$$R^{1A}\text{—}C(R^{2A})\text{=}N\text{—}O\text{—}SO_2\text{—}R^{3A} \quad (2)$$

In the formula (2), $R^{1A}$ represents an alkyl group having 1 to 6 carbon atoms, a halogenated alkyl group having 1 to 4 carbon atoms, a phenyl group, a biphenyl group, a naphthyl group, a 2-furyl group, a 2-thienyl group, an alkoxy group having 1 to 4 carbon atoms, or a cyano group. When $R^{1A}$ is a phenyl group, a biphenyl group, a naphthyl group or an anthranyl group, these groups may be substituted with a substituent selected from the group consisting of a halogen atom, a hydroxyl group, an alkyl group having 1 to 4 carbon atoms, an alkoxy group having 1 to 4 carbon atoms, and a nitro group.

In the formula (2), $R^{2A}$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W, a dialkylamino group, a morpholino group, or a cyano group. $R^{2A}$ and $R^{1A}$ may be joined together to form a 5-membered ring or a 6-membered ring, and the 5-membered ring or the 6-membered ring may be bonded to a benzene ring which may be substituted with any one or two substituents.

In the formula (2), $R^{3A}$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W. W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

The alkyl group having 1 to 6 carbon atoms represented by $R^{1A}$ may be a linear or branched alkyl group, and examples include a methyl group, an ethyl group, a propyl group, an isopropyl group, a n-butyl group, a sec-butyl group, a tert-butyl group, a n-pentyl group, an isoamyl group, a n-hexyl group, and a 2-ethylbutyl group.

Examples of the halogenated alkyl group having 1 to 4 carbon atoms represented by $R^{1A}$ include a chloromethyl group, a trichloromethyl group, a trifluoromethyl group, and a 2-bromopropyl group.

Examples of the alkoxy group having 1 to 4 carbon atoms represented by $R^{1A}$ include a methoxy group and an ethoxy group.

When $R^{1A}$ represents a phenyl group, a biphenyl group, a naphthyl group or an anthranyl group, these groups may be substituted with a substituent selected from the group consisting of a halogen atom (for example, a chlorine atom, a bromine atom, or an iodine atom), a hydroxyl group, an alkyl group having 1 to 4 carbon atoms (for example, a methyl group, an ethyl group, a propyl group, an isopropyl group, a n-butyl group, a sec-butyl group, or a tert-butyl group), an alkoxy group having 1 to 4 carbon atoms (for example, a methoxy group, an ethoxy group, a n-propoxy group, an i-propoxy group, or a n-butoxy group), and a nitro group.

Specific examples of the alkyl group having 1 to 10 carbon atoms represented by $R^{2A}$ include a methyl group, an ethyl group, a n-propyl group, an i-propyl group, a n-butyl group, an i-butyl group, a s-butyl group, a t-butyl group, a n-amyl group, an i-amyl group, a s-amyl group, a n-hexyl group, a n-heptyl group, a n-octyl group, a n-nonyl group, and a n-decyl group.

Specific examples of the alkoxy group having 1 to 10 carbon atoms represented by $R^{2A}$ include a methoxy group, an ethoxy group, a n-propoxy group, an i-propoxy group, a n-butoxy group, a n-amyloxy group, a n-octyloxy group, and a n-decyloxy group.

Specific examples of the halogenated alkyl group having 1 to 5 carbon atoms represented by $R^{2A}$ include a trifluoromethyl group, a pentafluoroethyl group, a perfluoro-n-propyl group, a perfluoro-n-butyl group, and a perfluoro-n-amyl group.

Specific examples of the halogenated alkoxy group having 1 to 5 carbon atoms represented by $R^{2A}$ include a trifluoromethoxy group, a pentafluoroethoxy group, a perfluoro-n-propoxy group, a perfluoro-n-butoxy group, and a perfluoro-n-amyloxy group.

Specific examples of the phenyl group which may be substituted with W, as represented by $R^{2A}$, include an o-tolyl group, a m-tolyl group, a p-tolyl group, an o-ethylphenyl group, a m-ethylphenyl group, a p-ethylphenyl group, a p-(n-propyl)phenyl group, a p-(i-propyl)phenyl group, a p-(n-butyl)phenyl group, a p-(i-butyl)phenyl group, a p-(s-butyl)phenyl group, a p-(t-butyl)phenyl group, a p-(n-amyl)phenyl group, a p-(i-amyl)phenyl group, a p-(t-amyl)phenyl group, an o-methoxyphenyl group, a m-methoxyphenyl group, a p-methoxyphenyl group, an o-ethoxyphenyl group, a m-ethoxyphenyl group, a p-ethoxyphenyl group, a p-(n-propoxy)phenyl group, a p-(i-propoxy)phenyl group, a p-(n-butoxy)phenyl group, a p-(i-butoxy)phenyl group, a p-(s-butoxy)phenyl group, a p-(t-butoxy)phenyl group, a p-(n-amyloxy)phenyl group, a p-(i-amyloxy)phenyl group, a p-(t-amyloxy)phenyl group, a p-chlorophenyl group, a p-bromophenyl group, a p-fluorophenyl group, a 2,4-dichlorophenyl group, a 2,4-dibromophenyl group, a 2,4-difluorophenyl group, a 2,4,6-dichlorophenyl group, a 2,4,6-tribromophenyl group, a 2,4,6-trifluorophenyl group, a pentachlorophenyl group, a pentabromophenyl group, a pentafluorophenyl group, and a p-biphenylyl group.

Specific examples of the naphthyl group which may be substituted with W, as represented by $R^{2A}$, include a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 1-methyl-2-naphthyl group, a 3-methyl-2-naphthyl group, a 4-methyl-2-naphthyl group, a 5-methyl-2-naphthyl group, a 6-methyl-2-naphthyl group, a 7-methyl-2-naphthyl group, and an 8-methyl-2-naphthyl group.

Specific examples of the anthranyl group which may be substituted with W, as represented by $R^{2A}$, include a 2-methyl-1-anthranyl group, a 3-methyl-1-anthranyl group, a 4-methyl-1-anthranyl group, a 5-methyl-1-anthranyl group, a 6-methyl-1-anthranyl group, a 7-methyl-1-anthranyl group, an 8-methyl-1-anthranyl group, a 9-methyl-1-anthranyl group, a 10-methyl-1-anthranyl group, a 1-methyl-2-anthranyl group, a 3-methyl-2-anthranyl group, a 4-methyl-2-anthranyl group, a 5-methyl-2-anthranyl group, a 6-methyl-2-anthranyl group, a 7-methyl-2-anthranyl group, an 8-methyl-2-anthranyl group, a 9-methyl-2-anthranyl group, and a 10-methyl-2-anthranyl group.

Examples of the dialkylamino group represented by $R^{2A}$ include a dimethylamino group, a diethylamino group, a dipropylamino group, a dibutylamino group, and a diphenylamino group.

Specific examples of the alkyl group having 1 to 10 carbon atoms represented by $R^{3A}$ include a methyl group, an ethyl group, a n-propyl group, an i-propyl group, a n-butyl group, an i-butyl group, a s-butyl group, a t-butyl group, a n-amyl group, an i-amyl group, a s-amyl group, a n-hexyl group, a n-heptyl group, a n-octyl group, a n-nonyl group, and a n-decyl group.

Specific examples of the alkoxy group having 1 to 10 carbon atoms represented by $R^{3A}$ include a methoxy group, an ethoxy group, a n-propoxy group, an i-propoxy group, a n-butoxy group, a n-amyloxy group, a n-octyloxy group, and a n-decyloxy group.

Specific examples of the halogenated alkyl group having 1 to 5 carbon atoms represented by $R^{3A}$ include a trifluoromethyl group, a pentafluoroethyl group, a perfluoro-n-propyl group, a perfluoro-n-butyl group, and a perfluoro-n-amyl group.

Specific examples of the halogenated alkoxy group having 1 to 5 carbon atoms represented by $R^{3A}$ include a trifluoromethoxy group, a pentafluoroethoxy group, a perfluoro-n-propoxy group, a perfluoro-n-butoxy group, and a perfluoro-n-amyloxy group.

Specific examples of the phenyl group which may be substituted with W, as represented by $R^{3A}$, include an o-tolyl group, a m-tolyl group, a p-tolyl group, an o-ethylphenyl group, a m-ethylphenyl group, a p-ethylphenyl group, a p-(n-propyl)phenyl group, a p-(i-propyl)phenyl group, a p-(n-butyl)phenyl group, a p-(i-butyl)phenyl group, a p-(s-butyl)phenyl group, a p-(t-butyl)phenyl group, a p-(n-amyl)phenyl group, a p-(i-amyl)phenyl group, a p-(t-amyl)phenyl group, an o-methoxyphenyl group, a m-methoxyphenyl group, a p-methoxyphenyl group, an o-ethoxyphenyl group, a m-ethoxyphenyl group, a p-ethoxyphenyl group, a p-(n-propoxy)phenyl group, a p-(i-propoxy)phenyl group, a p-(n-butoxy)phenyl group, a p-(i-butoxy)phenyl group, a p-(s-butoxy)phenyl group, a p-(t-butoxy)phenyl group, a p-(n-amyloxy)phenyl group, a p-(i-amyloxy)phenyl group, a p-(t-amyloxy)phenyl group, a p-chlorophenyl group, a p-bromophenyl group, a p-fluorophenyl group, a 2,4-dichlorophenyl group, a 2,4-dibromophenyl group, a 2,4-difluorophenyl group, a 2,4,6-dichlorophenyl group, a 2,4,6-tribromophenyl group, a 2,4,6-trifluorophenyl group, a pentachlorophenyl group, a pentabromophenyl group, a pentafluorophenyl group, and a p-biphenylyl group.

Specific examples of the naphthyl group which may be substituted with W, as represented by $R^{3A}$, include a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 1-methyl-2-naphthyl group, a 3-methyl-2-naphthyl group, a 4-methyl-2-naphthyl group, a 5-methyl-2-naphthyl group, a 6-methyl-2-naphthyl group, a 7-methyl-2-naphthyl group, and an 8-methyl-2-naphthyl group.

Specific examples of the anthranyl group which may be substituted with W, as represented by $R^{3A}$, include a 2-methyl-1-anthranyl group, a 3-methyl-1-anthranyl group, a 4-methyl-1-anthranyl group, a 5-methyl-1-anthranyl group, a 6-methyl-1-anthranyl group, a 7-methyl-1-anthranyl group, an 8-methyl-1-anthranyl group, a 9-methyl-1-anthranyl group, a 10-methyl-1-anthranyl group, a 1-methyl-2-anthranyl group, a 3-methyl-2-anthranyl group, a 4-methyl-2-anthranyl group, a 5-methyl-2-anthranyl group, a 6-methyl-2-anthranyl group, a 7-methyl-2-anthranyl group, an 8-methyl-2-anthranyl group, a 9-methyl-2-anthranyl group, and a 10-methyl-2-anthranyl group.

Specific examples of the alkyl group having 1 to 10 carbon atoms, the alkoxy group having 1 to 10 carbon atoms, the halogenated alkyl group having 1 to 5 carbon atoms, and the halogenated alkoxy group having 1 to 5 carbon atoms, which are represented by W, include the same groups mentioned as specific examples of the alkyl group having 1 to 10 carbon atoms, the alkoxy group having 1 to 10 carbon atoms, the halogenated alkyl group having 1 to 5 carbon atoms, and the halogenated alkoxy group having 1 to 5 carbon atoms, which are represented by $R^{2A}$ or $R^{3A}$.

$R^{2A}$ and $R^{1A}$ may be joined together to form a 5-membered ring or a 6-membered ring.

When $R^{2A}$ and $R^{1A}$ are joined together to form a 5-membered ring or a 6-membered ring, the 5-membered ring or the 6-membered ring may be a carbocyclic group or a heterocyclic group, and examples thereof include cyclopentane, cyclohexane, cycloheptane, pyrrole, furane, thiophene, imidazole, oxazole, thiazole, pyrane, pyridine, pyrazine, morpholine, piperidine, and piperazine rings. The 5-membered ring or 6-membered ring may be bonded to a benzene ring which may be arbitrarily substituted, and examples thereof include tetrahydronaphthalene, dihydroanthracene, indene, chromane, fluorene, xanthene, and thioxanthene rings. The 5-membered ring or 6-membered ring may contain a carboxyl group, and examples thereof include cyclohexadienone, naphthalenone, and anthrone rings.

One of suitable embodiments of the compound represented by the formula (2) is a compound represented by the following formula (2-1). The compound represented by the formula (2-1) is a compound in which $R^{2A}$ and $R^{1A}$ in the formula (2) are joined to form a 5-membered ring.

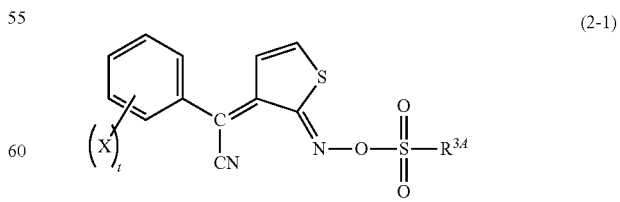

(2-1)

(In the formula (2-1), $R^{3A}$ has the same meaning as $R^{3A}$ in the formula (2); X represents an alkyl group, an alkoxy group or a halogen atom; t represents an integer from 0 to 3, and when t is 2 or 3, plural X's may be identical or different.)

The alkyl group represented by X is preferably a linear or branched alkyl group having 1 to 4 carbon atoms.

The alkoxy group represented by X is preferably a linear or branched alkoxy group having 1 to 4 carbon atoms.

The halogen atom represented by X is preferably a chlorine atom or a fluorine atom.

t is preferably 0 or 1.

A compound in which, in the formula (2-1), t is 1; X is a methyl group; the substitution position of X is the ortho-position; $R^{3A}$ is a linear alkyl group having 1 to 10 carbon atoms, a 7,7-dimethyl-2-oxonorbornylmethyl group or a p-toluoyl group, is particularly preferable.

Specific examples of the oxime sulfonate compound represented by the formula (2-1) include the following compound (i), compound (ii), compound (iii), compound (iv), and the like. These compounds may be used singly, or two or more kinds may be used in combination. The compounds (i) to (iv) are available as commercial products.

Furthermore, the oxime sulfonate compound can also be used in combination with a photo acid generator of different type.

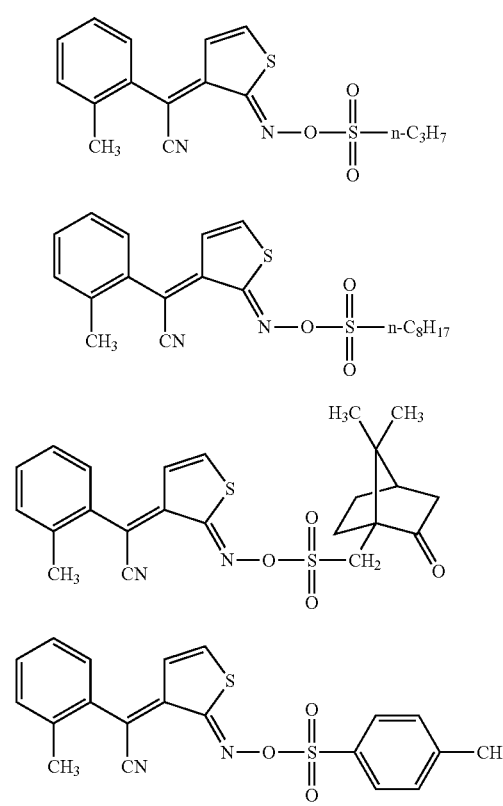

According to one preferable embodiment of the compound represented by the formula (2), $R^{1A}$ represents an alkyl group having 1 to 4 carbon atoms, a trifluoromethyl group, a phenyl group, a chlorophenyl group, a dichlorophenyl group, a methoxyphenyl group, a 4-biphenyl group, a naphthyl group, or an anthranyl group;

$R^{2A}$ represents a cyano group; and $R^{3A}$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W, while W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

The compound represented by the formula (2) may be preferably a compound represented by the following formula (2-2).

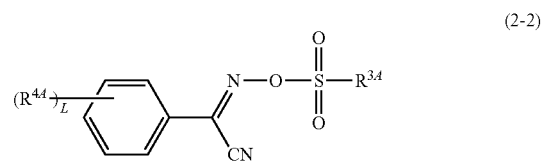

In the formula (2-2), $R^{4A}$ represents a halogen atom, a hydroxyl group, an alkyl group having 1 to 4 carbon atoms, an alkoxy group having 1 to 4 carbon atoms, or a nitro group; and L represents an integer from 0 to 5. $R^{3A}$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W; and W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

$R^{3A}$ in the formula (2-2) is preferably a methyl group, an ethyl group, a n-propyl group, a n-butyl group, a n-octyl group, a trifluoromethyl group, a pentafluoroethyl group, a perfluoro-n-propyl group, a perfluoro-n-butyl group, a p-tolyl group, a 4-chlorophenyl group, or a pentafluorophenyl group, and particularly preferably a methyl group, an ethyl group, a n-propyl group, a n-butyl group or a p-tolyl group.

The halogen atom represented by $R^{4A}$ is preferably a fluorine atom, a chlorine atom, or a bromine atom.

The alkyl group having 1 to 4 carbon atoms represented by $R^{4A}$ is preferably a methyl group or an ethyl group.

The alkoxy group having 1 to 4 carbon atoms represented by $R^{4A}$ is preferably a methoxy group or an ethoxy group.

L is preferably 0 to 2, and particularly preferably 0 to 1.

Among the compounds represented by the formula (2), a preferable embodiment of the compound included in the compounds represented by the formula (2-2) is a compound in which, in the formula (2), $R^{1A}$ represents a phenyl group or a 4-methoxyphenyl group; $R^{2A}$ represents a cyano group; and $R^{3A}$ represents a methyl group, an ethyl group, a n-propyl group, a n-butyl group, or a 4-tolyl group.

The compound represented by the formula (1) may be preferably a compound represented by the following formula (1-2).

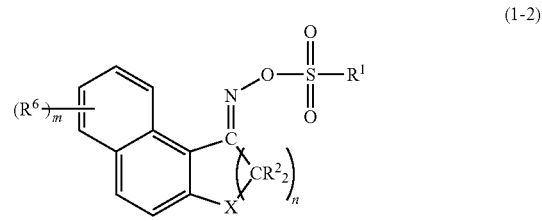

For the photosensitive resin composition, (Component B1) photo acid generator is preferably used in an amount of 0.1 to 10 parts by weight, and more preferably in an amount of 0.5 to 10 parts by weight, based on 100 parts by weight of Component A1.

(Component C1) Solvent

The photosensitive resin composition contains (Component C1) a solvent.

The photosensitive resin composition is preferably prepared as a solution in which Component A1 and Component B1, which are essential Components, and optional Components such as various additives that will be described below, as preferable Components, in (Component C1) solvent.

As (Component C1) solvent used in the photosensitive resin composition, a known solvent can be used, and examples include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, and lactones.

Among the solvents described above, diethylene glycol ethyl methyl ether, and/or propylene glycol monomethyl ether acetate are preferable, and propylene glycol monomethyl ether acetate are particularly preferable.

Solvent used in the present invention may be used singly or as mixtures of two or more kinds.

The content of (Component C1) solvent in the photosensitive resin composition is preferably 50 to 3,000 parts by weight, more preferably 100 to 2,000 parts by weight, and yet more preferably 150 to 1,500 parts by weight, per 100 parts by weight of Component A1.

(Component D1) Thermal Crosslinking Agent

The photosensitive resin composition preferably contains (Component D1) a thermal crosslinking agent, according to necessity. When the composition contains (Component D1) thermal crosslinking agent, the heat flow in the bake step can be suppressed. Component D1 according to the present invention is a compound other than Component A1, Component A2 and Component A3.

Preferable examples of the thermal crosslinking agent include a blocked isocyanate-based crosslinking agent, an alkoxymethyl group-containing crosslinking agent, an epoxy resin having an epoxy group, or a (meth)acrylic resin having a carboxyl group, which will be described later.

Among others, a blocked isocyanate-based crosslinking agent is particularly preferable from the viewpoints of resist sensitivity and storage stability. Furthermore, an alkoxymethyl group-containing crosslinking agent can also be suitably used, and the crosslinking agent preferably includes at least a methylolated melamine compound.

<Alkoxymethyl Group-Containing Crosslinking Agent>

The alkoxymethyl group-containing crosslinking agent is preferably alkoxymethylated melamine, akloxymethylated benzoguanamine, alkoxymethylated glycoluril, alkoxymethylated urea, or the like. These can be obtained by converting the respective methylol groups of methylolated melamine, methylolated benzoguanamine, methylolated glycoluril, and methylolated urea into alkoxymethyl groups. There are no particular limitations on the type of this alkoxymethyl group, and examples include a methoxymethyl group, an ethoxymethyl group, a propoxymethyl group, and a butoxymethyl group. However, from the viewpoint of the amount of outgas generation, a methoxymethyl group is particularly preferable.

Among these alkoxymethyl group-containing crosslinking agents, preferable examples of the alkoxymethyl group-containing crosslinking agent include alkoxymethylated melamine, alkoxymethylated benzoguanamine, and alkoxymethylated glycoluril. From the viewpoint of transparency, alkoxymethylated glycoluril is particularly preferable.

These alkoxymethyl group-containing crosslinking agents are available as commercial products, and preferable examples that can be used include CYMEL 300, 301, 303, 370, 325 (all manufactured by Mitsui Cyanamide, Ltd.); NIKALAC MX-750 and -270, NIKALAC MS-11, NIKALAC MW-30HM, -100 LM, and -390 (all manufactured by Sanwa Chemical Co., Ltd.). Among these, NIKALAC MX-270 and NIKALAC MW-100LM are particularly preferable.

In the case of using an alkoxymethyl group-containing crosslinking agent in the photosensitive resin composition, the addition amount of the alkoxymethyl group-containing crosslinking agent is preferably 0.05 to 50 parts by weight, more preferably 0.5 to 10 parts by weight, and yet more preferably 0.5 to 5 parts by weight, based on 100 parts by weight of Component A1. When the crosslinking agent is added in this range, high sensitivity, and preferable alkali solubility at the time of development are obtained.

<Blocked Isocyanate-Based Crosslinking Agent>

The blocked isocyanate-based crosslinking agent is not particularly limited as long as it is a compound having a blocked isocyanate group (blocked isocyanate compound). However, from the viewpoint of curability, the crosslinking agent is preferably a compound having two or more blocked isocyanate groups in one molecule.

The blocked isocyanate group according to the present invention is a group capable of producing an isocyanate group under the action of heat, and a preferable example may be a group protecting an isocyanate group by allowing a blocking agent to react with an isocyanate group. Furthermore, the blocked isocyanate group is preferably a group capable of producing an isocyanate group under the action of heat at 90° C. to 250° C.

There are no particular limitations on the skeleton of the blocked isocyanate-based crosslinking agent, and compounds having a hexamethylene diisocyanate (HDI) skeleton, an isophorone diisocyanate (IPDI) skeleton, and a prepolymer type skeleton derived from HDI or IPDI can be suitably used.

The blocking agent for the isocyanate group with regard to the blocked isocyanate group is not particularly limited, and an active methylene compound such as a diester compound, and an active hydrogen compound such as an oxime compound, a lactam compound or an amine compound can be preferably used. Among these, an active methylene compound is particularly preferable from the viewpoint of reactivity.

Examples of the active methylene compound include diethyl malonate, dimethyl malonate, ethyl acetoacetate, and methyl acetoacetate.

Examples of the oxime compound include cyclohexanone oxime, benzophenone oxime, and acetoxime.

Examples of the lactam compound include ε-caprolactam, and γ-butyrolactam.

Examples of the amine compound include aniline, diphenylamine, ethyleneimine, and polyethyleneimine.

The active hydrogen compound reacts with an isocyanate group as shown in the following formula, and forms a blocked isocyanate group.

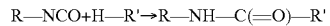

wherein H—R' represents an active hydrogen compound; H in H—R' represents an active hydrogen atom; R represents a moiety other than the isocyanate group in an isocyanate compound; and R' represents a moiety other than the active hydrogen atom in an active hydrogen compound.

These blocked isocyanate-based crosslinking agents are available as commercial products, and preferable examples that can be used include DURANATE MF-K60X, MF-K60B, MF-B60X, 17B-60P, TPA-B80E, E402-B80B, SBN-70D, and K6000 (all manufactured by Asahi Kasei Chemicals Corp.), DESMODUR BL3272 and BL3575/1 (all manufactured by Sumitomo Bayer Urethane Co., Ltd.), and UREHYPER PUR-1804 (manufactured by DIC Corp.). Among these, DURANATE MF-K60X, MF-K60B, SBN-70D and K6000 are particularly preferable.

In the case of using a blocked isocyanate crosslinking agent in the photosensitive resin composition, the addition amount of the blocked isocyanate-based crosslinking agent is preferably 0.1 to 50 parts by weight, more preferably 1 to 20 parts by weight, and yet more preferably 3 to 15 parts by weight, based on 100 parts by weight of Component A1. When the blocked isocyanate-based crosslinking agent is added in this range, high sensitivity, and preferable alkali solubility at the time of development can be obtained.

(Component E1) Compound Having Total Functional Group Equivalent for Epoxy Group, Oxetanyl Group, Hydroxyl Group and Carboxyl Group of 400 g/eq or Greater It is preferable for the photosensitive resin composition to add a compound having a total functional group equivalent for an epoxy group, an oxetanyl group, a hydroxyl group and a carboxyl group of 400 g/eq or greater, in order to suppress the curing shrinkage of the film and to obtain a rectangular profile after baking.

Component E1 is preferably a resin having a weight average molecular weight of 1,000 or greater.

Specific examples include copolymers including monomer units containing an epoxy group, an oxetanyl group, a hydroxyl group and/or a carboxyl group.

Furthermore, a compound which contains none of the functional groups described above, such as a homopolymer of polymethyl methacrylate (PMMA), can also be added as Component E1.

According to the present invention, when Component E1 satisfies the definition of Component D1, the compound is classified as belonging to both of the classes. For example, when Component E1 is an epoxy resin having an epoxy equivalent of 400 g/eq or greater, the epoxy resin is Component D1, and also Component E1. Component E1 according to the present invention is other than Component A1 and Component A2.

Furthermore, there are no particular limitations on the method of measuring the epoxy equivalent, oxetanyl equivalent, hydroxyl group equivalent and carboxyl group equivalent, and any known method can be used. For example, the equivalent can be calculated by measuring the content of the relevant group in a specific amount of the compound through titration or the like. For example, measurement can be made by making reference to the method described in JIS K7236, K0070 or the like.

<Epoxy Resin>

Component E1 is preferably an epoxy resin. When an epoxy resin is added, heat flow at the time of baking can be suppressed. Furthermore, the epoxy resin preferably has a large epoxy equivalent, so that curing shrinkage of the cross-linked film is suppressed, and a profile that is rectangular or close to a rectangle is obtained. Specifically, the epoxy equivalent is preferably 400 g/eq or greater, more preferably 400 to 1,000 g/eq, and particularly preferably 400 to 600 g/eq. When the epoxy equivalent is in this range, curing shrinkage occurs to a reduced extent, and a profile that is rectangular or close to a rectangle can be obtained. Also, the tolerance level of the process conditions at the time of production of a cured film is large.

Meanwhile, the method for measuring the epoxy equivalent is preferably carried out according to JIS K7236.

As the epoxy resin, commercially available products and synthesized products can be used. Specific examples of the epoxy resin having an epoxy equivalent of 400 g/eq or greater, which are commercially available, are listed below.

EPICLON 1050, 1055, 3050, 4050, 7050, AM-020-P, AM-040-P, HM-091, HM-101, 1050-70X, 1050-75X, 1055-75X, 1051-75M, 7070-40K, HM-091-40AX, 152, 153, 153-60T, 153-60M, 1121N-80M, 1123P-75M, TSR-601, 1650-75 MPX, 5500, 5800, 5300-70, 5500-60, EXA-4850-150, EXA-4850-1000, EXA-4816, and EXA-4822 (all manufactured by DIC Corp.

The addition amount of the epoxy resin is preferably 10 to 50 wt %, and particularly preferably 20 to 40 wt %, based on the total solids content of the photosensitive resin composition. When the addition amount is in this range, it is easier to obtain a profile that is rectangular or close to a rectangle, and to form a desired pattern by the development process.

The molecular weight (weight average molecular weight) of the epoxy resin is preferably 500 or greater. When the molecular weight is 500 or greater, volatilization of the epoxy resin in the solvent drying step or discharge of the epoxy resin in the development step can be suppressed, and thus the effect of adding an epoxy resin can be sufficiently obtained.

The epoxy resin can be used singly, or as mixtures of two or more kinds.

Furthermore, the photosensitive resin composition preferably contains an alkoxymethyl group-containing crosslinking agent and an epoxy resin having an epoxy equivalent of 400 g/eq or greater, from the viewpoint of obtaining a profile that is closer to rectangle.

<(Meth)Acrylic Resin Having Carboxyl Group>

Component E1 may be a (meth)acrylic resin having a carboxyl group.

The (meth)acrylic resin having a carboxyl group preferably has a large carboxyl group equivalent, in order to suppress curing shrinkage of the cross-linked film and to obtain a rectangular profile. Specifically, the carboxyl group equivalent is preferably 400 g/eq or greater, more preferably 400 to 1,000 g/eq, and particularly preferably 400 to 600 g/eq.

The (meth)acrylic resin having a carboxyl group can be obtained by using a known (meth)acrylic monomer, and the adjustment of the carboxyl group equivalent can be achieved by regulating the type of the monomer, and the amount ratios of the monomers.

The acrylic monomer is preferably, for example, an unsaturated monocarboxylic acid, a (meth)acrylic acid ester, a crotonic acid ester, or a (meth)acrylamide.

The (meth)acrylic resin having a carboxyl group is preferably a copolymer of benzyl (meth)acrylate and (meth)acrylic acid.

The content of Component E1 in the photosensitive resin composition is preferably 0.5 to 50 parts by weight, more preferably 1 to 40 parts by weight, and yet more preferably 5 to 30 parts by weight, based on 100 parts by weight of Component A1. When the content is in this range, it is easier to obtain a profile that is rectangular or close to a rectangle.

<Other Components>

The photosensitive resin composition may contain other Components other than Component A1 to Component E1.

As the other Components, it is preferable that the photosensitive resin composition contain (Component F1) a sensitizer, from the viewpoint of sensitivity. Also, from the viewpoint of sensitivity, it is preferable to add (Component G1) a development accelerator.

Furthermore, the photosensitive resin composition preferably contains (Component H1) an adhesion improving agent from the viewpoint of the adhesiveness to substrate, preferably contains (Component I1) a basic compound from the viewpoint of liquid storage stability, and preferably contains (Component J1) a surfactant (a fluorine-based surfactant, a silicone-based surfactant, or the like) from the viewpoint of coatability.

Furthermore, if necessary, known additives such as (Component K1) an antioxidant, (Component L1) a plasticizer, (Component M1) a thermal radical generator, (Component N1) a thermal acid generator, (Component O1) an acid amplifier, an ultraviolet absorbent, a thickening agent, and organic or inorganic precipitation preventing agent, can be added to the photosensitive resin composition.

Furthermore, from the viewpoint of obtaining a profile that is closer to rectangle, it is preferable that the photosensitive resin composition contain an epoxy resin having an epoxy equivalent of 400 g/eq or greater, (Component H1) an adhesion improving agent, (Component I1) a basic compound, and (Component J1) a surfactant, and it is particularly preferable that the composition contain an alkoxymethyl group-containing crosslinking agent, an epoxy resin having an epoxy equivalent of 400 g/eq or greater, (Component H1) an adhesion improving agent, (Component I1) a basic compound, and (Component J1) a surfactant.

Hereinafter, the other Components that can be contained in the photosensitive resin composition used in the present invention will be described.

(Component F1) Sensitizer (Component F1) a sensitizer can be added to the photosensitive resin composition, for the combination with (Component B1) the photo acid generator, in order to accelerate the decomposition of the photo acid generator. The sensitizer absorbs active rays or radiation, and enters an electron-excited state. The sensitizer in the electron-excited state is brought into contact with the photo acid generator, and actions such as electron transfer, energy transfer, and heat generation occur. Thereby, the photo acid generator undergoes a chemical change and is decomposed, thus producing an acid.

Preferable examples of the sensitizer include compounds which belong to the following compounds and have an absorption wavelength in the range of 350 nm to 450 nm.

Examples include polynuclear aromatic compounds (for example, pyrene, perylene, triphenylene, and anthracene), xanthenes (for example, fluorescein, eosin, erythrosine, rhodamin B, and Rose Bengal), xanthones (for example, xanthone, thioxanthone, dimethylthioxanthone, and diethylthioxanthone), cyanines (for example, thiacarbocyanine and oxacarbocyanine), merocyanines (for example, merocyanine and carbomerocyanine), rhodacyanines, oxonols, thiazines (for example, thionine, methylene blue, and toluidine blue), acridines (for example, acridine orange, chloroflavine, and acriflavine), acridones (for example, acridone and 10-butyl-2-chloroacridone), anthraquinones (for example, anthraquinone), squariums (for example, squarium), styryls, base styryls, and coumarins (for example, 7-diethylamino-4-methylcoumarin). Among these sensitizers, a sensitizer which absorbs active rays or radiation, enters an electron-excited state, and effects electron transfer to the photo acid generator is preferable, and polynuclear aromatic compounds, acridones, coumarins, and base styryls are particularly preferable.

In regard to the sensitizer, commercially available products may be used, or the sensitizer may be synthesized by a known synthesis method.

The addition amount of the sensitizer is preferably 20 to 300 parts by weight, and particularly preferably 30 to 200 parts by weight, based on 100 parts by weight of (Component B1) photo acid generator.

(Component G1) Development Accelerator

The photosensitive resin composition preferably contains (Component G1) a development accelerator.

As (Component G1) the development accelerator, any compound having a development accelerating effect can be used, but the development accelerator is preferably a compound having at least one kind of structure selected from the group consisting of a carboxyl group, a phenolic hydroxyl group, and an alkyleneoxy group, more preferably a compound having a carboxyl group or a phenolic hydroxyl group, and most preferably a compound having a phenolic hydroxyl group.

Furthermore, the molecular weight of (Component G1) the development accelerator is preferably 100 to 2,000, more preferably 150 to 1,500, and particularly preferably 150 to 1,000.

Examples of the development accelerator include, as the compound having an alkyleneoxy group, polyethylene glycol, monomethyl ether of polyethylene glycol, dimethyl ether of polyethylene glycol, polyethylene glycol glyceryl ester, polypropylene glycol glyceryl ester, polypropylene glycol diglyceryl ester, polybutylene glycol, polyethylene glycol-bisphenol A ether, polypropylene glycol-bisphenol A ether, alkyl ether of polyoxyethylene, alkyl ester of polyoxyethylene, and the compounds described in JP-A-9-222724.

Examples of the compound having a carboxyl group include the compounds described in JP-A-2000-66406, JP-A-9-6001, JP-A-10-20501, JP-A-11-338150, and the like.

Examples of the compound having a phenolic hydroxyl group include the compounds described in JP-A-2005-346024, JP-A-10-133366, JP-A-9-194415, JP-A-9-222724, JP-A-11-171810, JP-A-2007-121766, JP-A-9-297396, JP-A-2003-43679, and the like. Among these, a phenol compound having 2 to 10 benzene rings is suitable, and a phenol compound having 2 to 5 benzene rings is more suitable. Particularly preferable examples include the phenolic compounds disclosed as dissolution accelerators in JP-A-10-133366.

(Component G1) the development accelerator may be used singly, or two or more kinds may also be used in combination.

The addition amount of (Component G1) the development accelerator in the photosensitive resin composition is preferably 0.1 to 30 parts by weight, more preferably 0.2 to 20 parts by weight, and most preferably 0.5 to 10 parts by weight, based on 100 parts by weight of Component A1, from the viewpoint of sensitivity and the residual film ratio.

(Component H1) Adhesion Improving Agent

The photosensitive resin composition preferably contains (Component H1) an adhesion improving agent.

(Component H1) the adhesion improving agent that can be used in the photosensitive resin composition is a compound which enhances adhesiveness between an inorganic substance that forms a substrate, for example, a silicon compound such as silicon, silicon oxide, or silicon nitride, or a metal such as gold, copper or aluminum, and an insulating film. Specific examples include a silane coupling agent, and a thiol-based compound. The silane coupling agent as (Component H1) the adhesion improving agent used in the present invention is intended for the modification of the interface, and any known silane coupling agent can be used without particular limitations.

Preferable examples of the silane coupling agent include γ-aminopropyltrimethoxysilane, γ-aminopropyltriethoxysilane, γ-glycidoxypropyltrialkoxysilane, γ-glycidoxypropylalkyldialkoxysilane, γ-methacryloxypropyltrialkoxysilane, γ-methacryloxypropylalkyldialkoxysilane, γ-chloropropyltrialkoxysilane, γ-mercaptopropyltrialkoxysilane, β-(3,4-epoxycyclohexyl)ethyltrialkoxysilane, and vinyltrialkoxysilane.

Among these, γ-glycidoxypropyltrialkoxysilane, and γ-methacryloxypropyltrialkoxysilane are more preferable, and γ-glycidoxypropyltrialkoxysilane is yet more preferable.

These can be used singly, or in combination of two or more kinds. These are effective in the enhancement of the adhesiveness to the substrate, and are also effective in the regulation of the taper angle with the substrate.

The content of (Component H1) the adhesion improving agent in the photosensitive resin composition is preferably 0.1 to 20 parts by weight, and more preferably 0.5 to 10 parts by weight, based on 100 parts by weight of Component A1.

(Component I1) Basic Compound

The photosensitive resin composition preferably contains (Component I1) a basic compound.

As (Component I1) basic compound, any compound among those used in chemically amplified resists can be selected and used. Examples include an aliphatic amine, an aromatic amine, a heterocyclic amine, a quaternary ammonium hydroxide, and a quaternary ammonium salt of a carboxylic acid.

Examples of the aliphatic amine include trimethylamine, diethylamine, triethylamine, di-n-propylamine, tri-n-propylamine, di-n-pentylamine, tri-n-pentylamine, diethanolamine, triethanolamine, dicyclohexylamine, and dicyclohexylmethylamine.

Examples of the aromatic amine include aniline, benzylamine, N,N-dimethylaniline, and diphenylamine.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinic acid amide, quinoline, 8-oxyquinoline, pyrazine, pyrazole, pyridazine, purine, pyrrolidine, piperidine, piperazine, morpholine, 4-methylmorpholine, 1,5-diazabicyclo[4.3.0]-5-nonene, and 1,8-diazabicyclo[5.3.0]-7-undecene.

Examples of the quaternary ammonium hydroxide include tetramethylammonium hydroxide, tetraethylammonium hydroxide, tetra-n-butylammonium hydroxide, and tetra-n-hexylammonium hydroxide.

Examples of the quaternary ammonium salt of a carboxylic acid include tetramethylammonium acetate, tetramethylammonium benzoate, tetra-n-butylammonium acetate, and tetra-n-butylammonium benzoate.

The basic compound that can be used in the present invention may be used singly, or two or more kinds may be used in combination.

The content of (Component I1) basic compound in the photosensitive resin composition is preferably 0.001 to 1 part by weight, and more preferably 0.002 to 0.2 parts by weight, based on 100 parts by weight of Component A1.

(Component J1) Surfactant (Fluorine-Based Surfactant, Silicone-Based Surfactant, or the Like)

The photosensitive resin composition preferably contains (Component J1) a surfactant (a fluorine-based surfactant, a silicone-based surfactant, or the like).

A preferable example of the surfactant may be a copolymer (3) including a constituent unit A and a constituent unit B represented by the following formulae. The weight average molecular weight (Mw) of the copolymer is preferably from 1,000 to 10,000, and more preferably from 1,500 to 5,000. The weight average molecular weight is a value measured by gel permeation chromatography (GPC) and calculated relative to polystyrene standards.

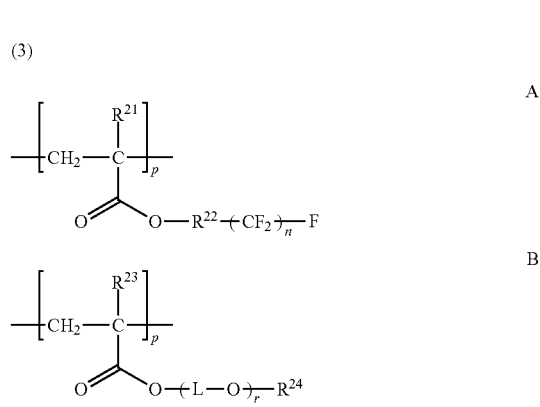

(3)

In the copolymer (3), $R^{21}$ and $R^{23}$ each independently represent a hydrogen atom or a methyl group; $R^{22}$ represents a linear alkylene group having from 1 to 4 carbon atoms; $R^{24}$ represents a hydrogen atom or an alkyl group having from 1 to 4 carbon atoms; L represents an alkylene group having from 3 to 6 carbon atoms; p and q represent weight percentages representing polymerization ratios, while p represents a value of from 10 wt % to 80 wt %, and q represents a value of from 20 wt % to 90 wt %; r represents an integer from 1 to 18; and n represents an integer from 1 to 10.

L in the constituent unit B is preferably an alkylene group represented by the following formula (4).

(4)

In the formula (4), $R^{25}$ represents an alkyl group having from 1 to 4 carbon atoms, and from the viewpoints of compatibility and wettability to the surface to be coated, an alkyl group having from 1 to 3 carbon atoms is preferable, and an alkyl group having 2 or 3 carbon atoms is more preferable.

Furthermore, the sum of p and q (p+q) is preferably such that p+q=100, that is, 100 wt %.

Specific examples of the fluorine-based surfactant and the silicone-based surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2001-330953, and the like, and commercially available surfactants can also be used. Examples of commercially available surfactants that can be used include fluorine-based surfactants such as EFTOP EF301 and EF303 (all manufactured by Mitsubishi Materials Electronic Chemicals Co., Ltd.), FLUORAD FC430 and 431

(all manufactured by Sumitomo 3M, Ltd.), MEGAFAC F171, F173, F176, F189 and R08 (all manufactured by DIC Corp.), SURFLON S-382, SC101, 102, 103, 104, 105 and 106 (all manufactured by Asahi Glass Co., Ltd.), and POLYFOX series (manufactured by OMNOVA Solutions, Inc.); and silicone-based surfactants. Furthermore, Polysiloxane Polymer KP-341 (manufactured by Shin-Etsu Chemical Co., Ltd.) can also be used as a silicone-based surfactant.

These surfactants can be used singly, or as mixtures of two or more kinds. Furthermore, fluorine-based surfactants and silicone-based surfactants may also be used in combination.

The addition amount of (Component J1) surfactant (a fluorine-based surfactant, a silicone-based surfactant, or the like) in the photosensitive resin composition is preferably 10 parts by weight or less, more preferably 0.01 to 10 parts by weight, and yet more preferably 0.01 to 1 part by weight, based on 100 parts by weight of Component A1.

(Component K1) Antioxidant

The photosensitive resin composition may contain (Component K1) an antioxidant.

As (Component K1) the antioxidant, the photosensitive resin composition can contain a known antioxidant. When (Component K1) the antioxidant is added, coloration of the cured film can be prevented. The antioxidant also advantages that it can also reduce a decrease in the film thickness due to decomposition, and has excellent heat resistance and transparency.

Examples of such an antioxidant include phosphorus-based antioxidants, hydrazides, hindered amine-based antioxidants, sulfur-based antioxidants, phenol-based antioxidants, ascorbic acid compounds, zinc sulfate, sugars, nitrites, sulfites, thiosulfates, and hydroxylamine derivatives. Among these, phenol-based antioxidants are particularly preferable from the viewpoint of the coloration of the cured film and a decrease in the film thickness. These may be used singly, or may be used in combination of two or more kinds.

Examples of commercially available products of the phenolic antioxidants include ADK STAB AO-60, ADK STAB AO-80 (all manufactured by Adeka Corp.), and IRGANOX 1098 (manufactured by Ciba-Geigy Japan, Ltd.).

The content of (Component K1) the antioxidant is preferably 0.1 to 6 wt %, more preferably 0.2 to 5 wt %, and particularly preferably 0.5 to 4 wt %, based on the total solids content of the photosensitive resin composition. When the content is in this range, sufficient transparency of the formed film is obtained, and the sensitivity at the time of pattern formation also becomes satisfactory.

Furthermore, various ultraviolet absorbents, metal inactivators and the like described in "Kobunshi Tenkazai no Shintenkai (New Development of Polymer Additives; Nikkan Kogyo Shimbun, Ltd.)" may also be added to the photosensitive resin composition, as additives other than the antioxidant.

(Component L1) Plasticizer

The photosensitive resin composition may contain (Component L1) a plasticizer.

Examples of (Component L1) the plasticizer include dibutyl phthalate, dioctyl phthalate, didodecyl phthalate, polyethylene glycol, glycerin, dimethyl glycerin phthalate, dibutyl stannate, dioctyl adipate, and triacetylglycerin.

The content of (Component L1) the plasticizer in the photosensitive resin composition is preferably 0.1 to 30 parts by weight, and more preferably 1 to 10 parts by weight, based on 100 parts by weight of Component A1.

(Component M1) Thermal Radical Generator

The photosensitive resin composition may contain (Component M1) a thermal radical generator, and when the composition contains an ethylenic unsaturated compound such as a compound having at least one ethylenic unsaturated double bond described above, it is preferable that the composition contains (Component M1) the thermal radical generator.

As the thermal radical generator, a known thermal radical generator can be used.

The thermal radical generator is a compound which generates a radical under the action of thermal energy, and initiates or accelerates the polymerization reaction of a polymerizable compound. When the thermal radical generator is added, the cured film thus obtained becomes tougher, and heat resistance and solvent resistance may increase.

Preferable examples of the thermal radical generator include aromatic ketones, onium salt compounds, organic peroxides, thio compounds, hexaarylbiimidazole compounds, keto oxime ester compounds, borate compounds, azinium compounds, metallocene compounds, active ester compounds, compounds having a carbon-halogen bond, azo compounds, and bibenzyl compounds.

(Component M1) the thermal radical generator may be used singly, or can also be used in combination of two or more kinds.

The content of (Component M1) the thermal radical generator in the photosensitive resin composition is preferably 0.01 to 50 parts by weight, more preferably 0.1 to 20 parts by weight, and most preferably 0.5 to 10 parts by weight, based on 100 parts by weight of Component A1, from the viewpoint of an enhancement of the film properties.

(Component N1) Thermal Acid Generator

According to the present invention, (Component N1) a thermal acid generator may be used to improve the film properties and the like under low temperature curing.

The thermal acid generator is a compound which generates an acid under the action of heat, and is preferably a compound having a thermal decomposition point in the range of 130° C. to 250° C., and more preferably 150° C. to 220° C. For example, the thermal acid generator is a compound which generates a less nucleophilic acid such as sulfonic acid, carboxylic acid, or disulfonylimide.

The acid to be generated is preferably strong sulfonic acid having a pKa value of 2 or less, an alkylcarboxylic acid or arylcarboxylic acid substituted with an electron-withdrawing group, or disulfonylimide substituted with a similar electron-withdrawing group. Examples of the electron-withdrawing group include a halogen atom such as a fluorine atom, a haloalkyl group such as a trifluoromethyl group, a nitro group, and a cyano group.

According to the present invention, it is also preferable to use a sulfonic acid ester which substantially does not generate an acid under irradiation of exposure light, but generates an acid under the action of heat.

That an acid is substantially not generated under irradiation of exposure light can be judged by measuring the IR spectrum and the NMR spectrum before and after the exposure of the compound, and observing if there is no change in the spectra.

The molecular weight of the thermal acid generator is preferably 230 to 1,000, and more preferably 230 to 800.

For the sulfonic acid ester that can be used in the present invention, a commercially available product may be used, or a product synthesized by a known method may also be used. The sulfonic acid ester may be synthesized by, for example, allowing sulfonyl chloride or sulfonic acid anhydride to react with a corresponding polyhydric alcohol under basic conditions.

The content of the photosensitive resin composition of the thermal acid generator is preferably 0.5 to 20 parts by weight, and particularly preferably 1 to 15 parts by weight, based on 100 parts by weight of Component A1.

(Component O1) Acid Amplifier

The photosensitive resin composition can use (Component O1) an acid amplifier for the purpose of sensitivity enhancement. The acid amplifier used in the present invention is a compound which can further generate an acid by an acid-catalyzed reaction, and can increase the acid concentration within the reaction system, and is a compound which stably exists in the state where acid is not present. Since such a compound causes an increase in one or more acid molecules through a single reaction, the reaction proceeds in an accelerating manner along with the progress of the reaction. However, because the generated acid itself causes self-decomposition, the strength of the acid generated here is preferably 3 or less, and particularly preferably 2 or less, in terms of the acid dissociation constant, pKa.

Specific examples of the acid amplifier include the compound described in paragraphs 0203 to 0223 of JP-A-10-1508, paragraphs 0016 to 0055 of JP-A-10-282642, and page 39, line 12 to page 47, line 2 of JP-T-9-512498.

The acid amplifier that can be used in the present invention may be a compound which is decomposed by the acid generated from an acid generator, and generates an acid having a pKa value of 3 or less, such as dichloroacetic acid, trichloroacetic acid, methanesulfonic acid, benzenesulfonic acid, trifluoromethanesulfonic acid, or phenylphosphonic acid.

The content of the acid amplifier in the photosensitive resin composition is preferably set to 10 to 1,000 parts by weight from the viewpoint of dissolution contrast of exposed areas and unexposed areas, and more preferably 20 to 500 parts by weight, based on 100 parts by weight of (Component B1) the photo acid generator.

The photosensitive resin composition of the first embodiment is particularly preferably a chemically amplified type positive type photosensitive resin composition (a chemically amplified positive type photosensitive resin composition).

The second embodiment which is a preferable embodiment of the photosensitive composition is a photosensitive resin composition containing (Component A2) a polymer including a monomer unit (a2-1) having a carboxyl group or a phenolic hydroxyl group, and a monomer unit (a2-2) having an epoxy group and/or an oxetanyl group; (Component B2) a quinonediazide compound; and (Component C2) a solvent.

The photosensitive resin composition of the second embodiment is particularly preferably a positive type photosensitive resin composition.

(Component A2) Polymer Including a Monomer Unit (a2-1) and the Monomer Unit (a2-2)

The photosensitive resin composition preferably contains (Component A2) a polymer including a monomer unit (a2-1) having a carboxyl group or a phenolic hydroxyl group, and a monomer unit (a2-2) having an epoxy group and/or an oxetanyl group.

Component A2 is a polymer which does not include the monomer unit (a1-1) described above.

The monomer unit (a2-1) is preferably a monomer unit having a carboxyl group or a phenolic hydroxyl group described in an item of monomer unit (a1-1).

The monomer unit (a2-2) is the same as the monomer unit (a1-2) described above, and preferable embodiments are also same.

Furthermore, Component A2 may also include a monomer unit, i.e., a monomer unit (a1-5), having a hydroxyl group other than the phenolic hydroxyl group in the monomer unit (a1-3) and the monomer unit (a1-4) described above.

The content of Component A2 in the photosensitive resin composition is preferably 20 wt % to 99 wt %, more preferably 40 wt % to 97 wt %, and yet more preferably 60 wt % to 95 wt %, based on the total solids content of the photosensitive resin composition. When the content is in this range, pattern formability is improved when the pattern is developed.

Furthermore, in the photosensitive resin composition, a resin other than Component A2 may be used in combination to the extent that the effect of the present invention is not impaired. However, the content of the resin other than Component A2 is preferably smaller than the content of Component A2 from the viewpoint of developability.

(Component B2) Quinonediazide Compound

The photosensitive resin composition preferably contains (Component B2) a quinonediazide compound.

Component B2 is preferably a 1,2-quinonediazide compound.

The quinonediazide compound is a quinonediazide compound which has a function to generate a carboxylic acid upon irradiation with radiation such as ultraviolet rays, and examples thereof include 1,2-benzoquinonediazide sulfonic acid ester, 1,2-naphthoquinonediazide sulfonic acid ester, 1,2-benzoquinonediazide sulfonic acid amide, and 1,2-naphthoquinonediazide sulfonic acid amide.

Furthermore, as Component B2, the compounds described in paragraphs 0018 to 0024 of JP-A-2003-307847 can be used.

(Component C2) Solvent

The photosensitive resin composition preferably contains (Component C2) a solvent.

The content of the (Component C2) solvent in the photosensitive resin composition is preferably 50 to 3,000 parts by weight, more preferably 100 to 2,000 parts by weight, and yet more preferably 150 to 1,500 parts by weight, per 100 parts by weight of Component A2.

Component C2 has the same meaning as Component C1 described above, and has the same preferable meanings.

<Other Components>

The photosensitive resin composition of the second embodiment may contain other Components other than Component A2 to Component C2.

Examples of the other Components include Components D1 to Components O1 described above, an ultraviolet absorbent, a thickening agent, and organic or inorganic precipitation preventing agent.

The third embodiment which is a preferable embodiment of the photosensitive composition is a photosensitive resin composition containing (Component A3) a polymer having a carboxyl group or a phenolic hydroxyl group; (Component B3) a photopolymerization initiator; (Component C3) a solvent; and (Component D3) a polymerizable monomer.

The photosensitive resin composition of the third embodiment is particularly preferably a negative type photosensitive resin composition.

(Component A3) Polymer Having a Carboxyl Group or a Phenolic Hydroxyl Group

The photosensitive resin composition preferably contains (Component A3) a polymer having a carboxyl group or a phenolic hydroxyl group.

Component A3 is a polymer which does not include the monomer unit (a1-1) described above.

The monomer unit (a3-1) having a carboxyl group or a phenolic hydroxyl group in Component A3 is preferably a monomer unit having a carboxyl group or a monomer unit having a phenolic hydroxyl group described above in the monomer unit (a1-1).

Furthermore, Component A3 may also include a monomer unit, i.e., monomer unit (a-5), having a hydroxyl group other than the phenolic hydroxyl group in the monomer unit (a1-2), the monomer unit (a1-3), and the monomer unit (a1-4) described above.

The content of Component A3 in the photosensitive resin composition is preferably 20 wt % to 95 wt %, more preferably 25 wt % to 80 wt %, and yet more preferably 30 wt % to 50 wt %, based on the total solids content of the photosensitive resin composition. When the content is in this range, pattern formability is improved when the pattern is developed.

Furthermore, in the photosensitive resin composition, a resin other than Component A3 may be used in combination to the extent that the effect of the present invention is not impaired. However, the content of the resin other than Component A3 is preferably smaller than the content of Component A3 from the viewpoint of developability.

(Component B3) Photopolymerization Initiator

The photosensitive resin composition preferably contains (Component B3) a photopolymerization initiator.

The photopolymerization initiator is a compound which can generate a radical species capable of initiating polymerization of the polymerizable monomer (Component D3) upon irradiation with actinic rays such as visible rays, ultraviolet rays, far-ultraviolet rays, electron beams and X rays.

Preferable examples of this photopolymerization generator include a photo-radical polymerization initiator such as oxime ester-based compounds, imidazole-based compounds, benzoin-based compounds, benzophenone-based compounds, α-diketone-based compounds, polynuclear quinone-based compounds, xanthone-based compounds, and diazo-based compounds.

With regard to Component B3, only one type thereof may be used or two or more types thereof may be used in combination.

Furthermore, Component B3 is preferably an oxime ester-based compound.

The content of (Component B3) photopolymerization initiator is preferably 0.01 to 80 parts by weight, and more preferably 1 to 60 parts by weight, based on 100 parts by weight of the polymerizable monomer.

(Component C3) Solvent

The photosensitive resin composition preferably contains (Component C3) a solvent.

The content of (Component C3) solvent in the photosensitive resin composition is preferably 50 to 3,000 parts by weight, more preferably 100 to 2,000 parts by weight, and yet more preferably 150 to 1,500 parts by weight, per 100 parts by weight of Component A3.

Component C3 has the same meaning as Component C1 described above, and has the same preferable meanings.

(Component D3) Polymerizable Monomer

The photosensitive resin composition preferably contains a polymerizable monomer.

The polymerizable monomer in the present invention is not particularly limited as long as it has a polymerizable and ethylenically unsaturated bond, but is preferably a monomer which has at least two polymerizable and ethylenically unsaturated bonds, the preferable monomer being capable of being polymerized by a radical species which is generated upon irradiation with radiation to (Component B3) the photopolymerization initiator.

Examples of such a polyfunctional monomer include, diacrylates or dimethacrylates of alkylene glycols such as ethylene glycol, or propylene glycol; diacrylates or dimethacrylates of polyalkylene glycols such as polyethylene glycol, or polypropylene glycol; polyacrylates or polymethacrylates of trivalent or greater polyhydric alcohols such as glycerin, trimethylolpropane, pentaerythritol, or dipentaerythritol, and modified dicarboxylic acids thereof; oligoacrylates or oligomethacrylates such as polyesters, urethane resins, alkyd resins, silicone resins, or spirane resins; diacrylates or dimethacrylates of polymers hydroxlated at both terminals such as poly-1,3-butadiene having a hydroxyl group at both terminals, polyisoprene having a hydroxyl group at both terminals, or polycaprolactone having a hydroxyl group at both terminals, as well as trisacryloyloxy ethyl phosphate, and trismethacryloyloxy ethyl phosphate.

Among these polyfunctional monomers, polyacrylates or polymethacrylates of trivalent or more polyhydric alcohols are preferable, and specific examples thereof include trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, succinic acid-modified pentaerythritol triacrylate, and succinic acid-modified pentaerythritol trimethacrylate; and trimethylolpropane triacrylate, pentaerythritol triacrylate, dipentaerythritol pentaacrylate, and dipentaerythritol hexaacrylate are particularly preferable.

The content of Component D3 is preferably 50 to 3.00 parts by weight, and more preferably 80 to 200 parts by weight, based on 100 parts by weight of the content of Component A3.

<Other Components>

The photosensitive resin composition of the third embodiment may contain other Components other than Component A3 to Component C3.

Examples of the other Components include Components E1 to Components O1 described above, an ultraviolet absorbent, a thickening agent, and an organic or inorganic precipitation preventing agent.

According to the present invention, there is provided a method for producing a resin pattern, which is capable of forming a resin pattern that is rectangular or close to a rectangle even after a formed resin pattern is heat-treated.

Examples

Next, the present invention will be described more specifically based on Examples. However, the present invention is not intended to be limited to these Examples. Unless particularly stated otherwise, "parts" and "percent (%)" are on a weight basis.

In the following Synthesis Examples, the following abbreviations represent the following compounds.

V-65: 2,2'-Azobis(2,4-dimethylvaleronitrile)

GMA: Glycidyl methacrylate

PGMEA: Propylene glycol monomethyl ether acetate

<Synthesis of Polymer A-1>

0.5 parts of phenothiazine was added to 144.2 parts (2 molar equivalents) of ethyl vinyl ether, and while the reaction system was cooled to 10° C. or below, 86.1 parts (1 molar equivalent) of methacrylic acid was added dropwise thereto. Subsequently, the reaction system was stirred for 4 hours at room temperature (25° C.). 5.0 parts of pyridinium p-toluenesulfonate was added to the system, and then the mixture was stirred for 2 hours at room temperature and left to stand overnight at room temperature. 5 parts of sodium hydrogen carbonate and 5 parts of sodium sulfate were added to the reaction liquid, and the mixture was stirred for 1 hour at room temperature. Insoluble materials were filtered, and then the filtrate was concentrated under reduced pressure at 40° C. or less. A residual yellow oily substance was distilled under reduced pressure, and 134.0 parts of 1-ethoxyethyl methacrylate in a fraction having a boiling point (bp.) of 43° C. to 45° C./7 mmHg was obtained as a colorless oily substance.

A mixed solution of 1-ethoxyethyl methacrylate (66.41 parts (0.4 molar equivalents)) thus obtained, methacrylic acid (6.9 parts (0.10 molar equivalents)), glycidyl methacrylate (GMA) (49.75 parts (0.35 molar equivalents)), 2-hydroxyethyl methacrylate (19.52 parts (0.15 molar equivalents)) and propylene glycol monomethyl ether acetate (PGMEA) (132.5 parts) was heated at 70° C. under a nitrogen gas stream. While this mixed solution was stirred, a mixed solution of a radical polymerization initiator V-65 (2,2'-azobis(2,4-dimethylvaleronitrile), manufactured by Wako Pure Chemical Industries, Ltd., 12.0 parts) and PGMEA (100.0 parts) was added dropwise to the mixed solution over 3.5 hours. After completion of the dropwise addition, the reaction solution was allowed to react for 4 hours at 70° C., and thereby a PGMEA solution of a copolymer A-1 (solids concentration: 40% by weight) was obtained. The weight average molecular weight (Mw) of the copolymer A-1 thus obtained, as measured by gel permeation chromatography (GPC), was 12,000.

<Synthesis of Polymers A-2 to A-7>

Polymers A-2 to A-7 were respectively synthesized in the same manner as in the synthesis of the polymer A-1, except that the various monomers used in the synthesis of the polymer A-1 were changed to the monomers forming the respective monomer units described in Table 1, and the use amounts of the monomers forming the respective monomer units were changed as described in Table 1. The addition amount of the radical polymerization initiator V-65 was respectively adjusted to obtain the molecular weight described in Table 1.

The abbreviations in Table 1 are as follows.
MAEVE: 1-Ethoxyethyl methacrylate
MATHF: Tetrahydrofuran-2-yl methacrylate
GMA: Glycidyl methacrylate
OXE: (3-Ethyloxetan-3-yl)methyl methacrylate (manufactured by Osaka Organic Chemical Industry, Ltd.)
St: Styrene
DCPM: Dicyclopentanyl methacrylate
HEMA: 2-Hydroxyethyl methacrylate
MAA: Methacrylic acid
HS: p-Hydroxystyrene
n-BMA: n-Butyl methacrylate
HS-EVE: Compound shown below (4-(1-ethoxy)ethoxy styrene)
BVGE: Vinylbenzyl glycidyl ether

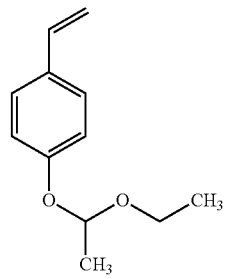

(Preparation of Photosensitive Resin Composition)

The various components shown in the following Table 2 were mixed to obtain homogeneous solutions, and then each of the solutions was filtered using a polyethylene filter having a pore size of 0.1 μm. Thus, the photosensitive resin compositions were respectively prepared. The following evaluations were respectively carried out using the photosensitive resin compositions 1 to 9 (Compositions 1 to 9) thus obtained. The evaluation results are shown in Table 3 and Table 4.

TABLE 1

| | Monomer unit (a1-1) | | Monomer unit (a1-2) | | Monomer unit (a1-3) | | Monomer unit (a1-4) | | Monomer unit (a1-5) | |
|---|---|---|---|---|---|---|---|---|---|---|
| | Type | Amount | Type | Amount | Type | Amount | Type | Amount | Type | Amount |
| A-1 | MAEVE | 40 | GMA | 35 | — | — | MAA | 10 | HEMA | 15 |
| A-2 | MATHF | 40 | OXE | 40 | — | — | MAA | 10 | HEMA | 10 |
| A-3 | MAEVE | 40 | GMA | 40 | DCPM | 7.5 | MAA | 7.5 | — | — |
| A-4 | HS-EVE | 30 | BVGE | 30 | St | 30 | HS | 10 | — | — |

| | Monomer unit (a2-1) | | Monomer unit (a2-2) | | Monomer unit (a1-3) | | Monomer unit (a1-4) | | Monomer unit (a1-5) | |
|---|---|---|---|---|---|---|---|---|---|---|
| | Type | Amount | Type | Amount | Type | Amount | Type | Amount | Type | Amount |
| A-5 | MAA | 35 | GMA | 35 | DCPM | 15 | HEMA | 5 | MMA | 10 |
| A-6 | HS | 35 | BVGE | 35 | St | 30 | — | — | — | — |

| | Monomer unit (a3-1) | | Monomer unit (a2-2) | | Monomer unit (a1-3) | | Monomer unit (a1-4) | | Monomer unit (a1-5) | |
|---|---|---|---|---|---|---|---|---|---|---|
| | Type | Amount | Type | Amount | Type | Amount | Type | Amount | Type | Amount |
| A-7 | MAA | 35 | GMA | 35 | DCPM | 15 | HEMA | 10 | MMA | 5 |

The amount described in Table 1 is a molar ratio, and represents a copolymerization ratio of the monomer units derived from the various monomers described in the Type column. The symbol "—" in Table 1 indicates that the relevant monomer unit was not used.

TABLE 2

| | Polymer | | Photo acid generator | | Thickening agent | | Basic compound | | Additive | | Additive |
|---|---|---|---|---|---|---|---|---|---|---|---|
| | Type | Parts | Type | Parts | Type | Parts | Type | Parts | Type | Parts | Type |
| Composition 1 | A-1 | 100 | B-1 | 2 | — | — | I-1/I-2 | 0.01/0.01 | — | — | E-1 |
| Composition 2 | A-2 | 100 | B-2 | 2 | F-1 | 2 | I-1/I-2 | 0.01/0.01 | — | — | E-1 |
| Composition 3 | A-3 | 100 | B-3 | 2 | — | — | I-1/I-2 | 0.01/0.01 | — | — | — |
| Composition 4 | A-4 | 100 | B-3 | 2 | — | — | I-1/I-2 | 0.01/0.01 | D-1 | 2 | D-2 |
| Composition 5 | A-2 | 100 | B-3 | 2 | — | — | I-1/I-2 | 0.01/0.01 | D-2 | 10 | E-1 |
| Composition 6 | A-2 | 100 | B-4 | 2 | F-1 | 2 | I-1/I-2 | 0.01/0.01 | D-2 | 4 | E-1 |
| Composition 7 | A-5 | 80 | B-5 | 20 | — | — | — | — | — | — | E-1 |
| Composition 8 | A-6 | 80 | B-5 | 20 | — | — | — | — | D-2 | 5 | E-1 |
| Composition 9 | A-7 | 100 | B-6 | 10 | — | — | — | — | D-3 | 100 | E-1 |

| | Additive | | | Surfactant | | Adhesion improving agent | | Solvent | |
|---|---|---|---|---|---|---|---|---|---|
| | Parts | Type | Parts | Type | Parts | Type | Parts | Type | Parts |
| Composition 1 | 20 | — | — | J-1 | 0.25 | H-1 | 3 | C-1 | 200 |
| Composition 2 | 20 | — | — | J-1 | 0.25 | H-1 | 3 | C-1 | 200 |
| Composition 3 | — | E-2 | 20 | J-1 | 0.25 | H-1 | 3 | C-1 | 200 |
| Composition 4 | 6 | E-1 | 2 | J-1 | 0.25 | H-1 | 3 | C-1 | 200 |
| Composition 5 | 8 | E-2 | 16 | J-1 | 0.25 | H-1 | 3 | C-1 | 200 |
| Composition 6 | 16 | — | — | J-1 | 0.25 | H-1 | 3 | C-1 | 200 |
| Composition 7 | 10 | — | — | J-1 | 0.25 | H-1 | 3 | C-1 | 200 |
| Composition 8 | 5 | — | — | J-1 | 0.25 | H-1 | 3 | C-1 | 200 |
| Composition 9 | 5 | — | — | J-1 | 0.25 | H-1 | 3 | C-1 | 200 |

The abbreviations in Table 2 are as follows.

B-1: CGI1397 (compound shown below, manufactured by Ciba Specialty Chemicals)

B-2: α-(p-Toluenesulfonyloxyimino)phenylacetonitrile (the synthesis method is as shown below.)

B-3: Oxime sulfonate compound synthesized by the synthesis method shown below

B-4: 4,7-di-n-Butoxy-1-naphthyl tetrahydrothiophenium trifluoromethane sulfonate B-5: A condensate of 2,3,4,4'-tetrahydroxybenzophenone (1 mol) and 1,2-naphthoquinonediazide-4-sulfonyl chloride (2 mol) (2,3,4,4'-tetrahydroxybenzophenone-1,2-naphthoquinonediazide 4-sulfonic acid ester)

B-6: IRGACURE OXE 02 (manufactured by BASF, an oxime ester type radical polymerization initiator)

C-1: Propylene glycol monomethyl ether acetate

D-1: NIKALAC MW-100LM (manufactured by Sanwa Chemical Co., Ltd.)

D-2: DURANATE MF-K60X (blocked isocyanate-based crosslinking agent, active methylene-protected polyfunctional type, manufactured by Asahi Kasei Chemicals Corp.)

D-3: KAYARAD DPHA (dipentaerythritol hexaacrylate, manufactured by Nippon Kayaku Co., Ltd.)

E-1: EPICLON EXA-4816 (manufactured by DIC Corp., epoxy equivalent: 403 g/eq)

E-2: JER157S65 (manufactured by Mitsubishi Chemical Corp., epoxy equivalent: 200 to 220 g/eq)

F-1: 9,10-Dibutoxyanthracene (DBA)

H-1: 3-Glycidoxypropyltrimethoxysilane (KBM-403 (manufactured by Shin-Etsu Chemical Co., Ltd.))

I-1: 1,5-Diazabicyclo[4.3.0]-5-nonene

I-2: Triphenylimidazole

J-1: Compound W-3 shown below

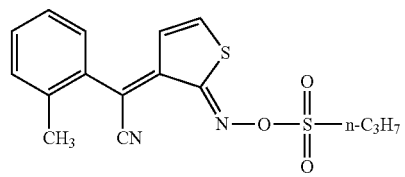

CGI 1397

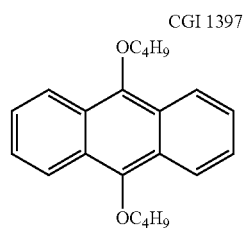

DBA

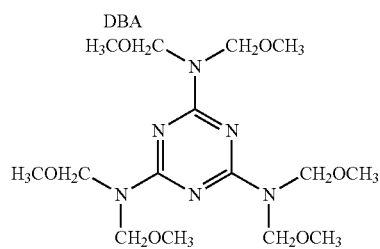

MW - 100LM

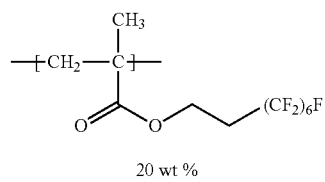

W-3

20 wt %

-continued

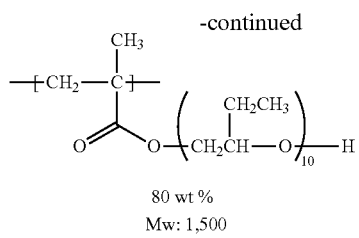

80 wt %
Mw: 1,500

<Synthesis of B-2>

α-(p-Toluenesulfonyloxyimino)phenylacetonitrile was synthesized according to the method described in paragraph 0108 of JP-T-2002-528451.

<Synthesis of B-3>

Aluminum chloride (10.6 g) and 2-chloropropionyl chloride (10.1 g) were added to a suspension solution of 2-naphthol (10 g) and chlorobenzene (30 mL), and the mixture liquid was heated to 40° C. to allow the mixture to react for 2 hours. Under ice cooling, a 4 N aqueous HCl solution (60 mL) was added dropwise to the reaction liquid, ethyl acetate (50 mL) was added thereto, and the mixture was partitioned. Potassium carbonate (19.2 g) was added to the organic layer, and the mixture was allowed to react at 40° C. for 1 hour. Subsequently, a 2 N aqueous HCl solution (60 mL) was added thereto, and the mixture was partitioned. The organic layer was concentrated, and then crystals were reslurried in diisopropyl ether (10 mL). The slurry was filtered and dried, and thus a ketone compound (6.5 g) was obtained.

Acetic acid (7.3 g) and a 50% aqueous solution of hydroxylamine (8.0 g) were added to a suspension solution of the ketone compound thus obtained (3.0 g) and methanol (30 mL), and the mixture was heated to reflux. After the system was left to cool, water (50 mL) was added, and precipitated crystals were filtered and washed with cold methanol. The crystals were dried, and thus an oxime compound (2.4 g) was obtained.

The oxime compound (1.8 g) thus obtained was dissolved in acetone (20 mL), and under ice cooling, triethylamine (1.5 g) and p-toluenesulfonyl chloride (2.4 g) were added thereto. The mixture was heated to room temperature, and was allowed to react for 1 hour. Water (50 mL) was added to the reaction liquid, and precipitated crystals were filtered. Subsequently, the crystals were reslurried in methanol (20 mL), and the slurry was filtered and dried. Thus, B-3 (2.3 g) was obtained.

The $^1$H-NMR spectrum (300 MHz, CDCl$_3$) of B-3 was as follows: δ=8.3 (d, 1H), 8.0 (d, 2H), 7.9 (d, 1H), 7.8 (d, 1H), 7.6 (dd, 1H), 7.4 (dd, 1H) 7.3 (d, 2H), 7.1 (d, 1H), 5.6 (q, 1H), 2.4 (s, 3H), 1.7 (d, 3H).

(1) Evaluation of Sensitivity (the First Embodiment, and the Second Embodiment) (Compositions 1 to 8)

A photosensitive resin composition was slit coated on a silicon wafer having a silicon oxide film, and then the silicon wafer was pre-baked on a hot plate at 90° C. for 120 seconds. Thus, a coating film having a thickness of 15 µm was formed.

Subsequently, the film was exposed through a predetermined mask using an i-line stepper (FPA-3000 i5$^+$ manufactured by Canon, Inc.). The substrate was developed by a paddling method using a 2.38% aqueous solution of tetramethylammonium hydroxide at 23° C. for 90 seconds. The substrate was rinsed with ultrapure water for 45 seconds. The optimum exposure amount (Eopt) which was capable of resolution of a line-and-space pattern with a line width of 20 µm at 1:1 by these operations, was defined as sensitivity.

1: Eopt less than 100 mJ/cm$^2$
2: Eopt equal to or greater than 100 mJ/cm$^2$ and less than 300 mJ/cm$^2$
3: Eopt equal to or greater than 300 mJ/cm$^2$ The higher sensitivity, the more preferable, and grade 1 or 2 is in a range of practical use.

(1') Evaluation of Sensitivity (the Third Embodiment) (Composition 9)

For the Composition 9, which is a negative type photosensitive resin composition, under the same conditions as described in the above (1), the optimum exposure amount which was capable of resolution of a line-and-space pattern with a line width of 20 µm at 1:1 was measured. The result of the measurement was 50 mJ/cm$^2$.

TABLE 3

| Composition | Sensitivity |
| --- | --- |
| Composition 1 | 1 |
| Composition 2 | 1 |
| Composition 3 | 1 |
| Composition 4 | 1 |
| Composition 5 | 1 |
| Composition 6 | 2 |
| Composition 7 | 2 |
| Composition 8 | 2 |
| Composition 9 | 50 mJ/cm$^2$ |

It was found that as a photo acid generator, when an oxime sulfonate compound is used, the composition has a high sensitivity.

(2) Production and Evaluation of Resin Pattern (Examples 1 to 10, and Comparative Examples 1 to 9).

A photosensitive resin composition was slit coated on a silicon wafer having a silicon oxide film. Subsequently, the solvent was removed to a hot plate at 90° C. for 120 seconds. Thus, a coating film having a thickness of 15 µm was formed.

Subsequently, the film was exposed through a predetermined mask using an i-line stepper (FPA-3000 i5$^+$ manufactured by Canon, Inc.) with an optimum exposure amount.

Subsequently, the substrate was developed by a paddling method using a 2.38 wt % aqueous solution of tetramethylammonium hydroxide at 23° C. for 90 seconds. The substrate was rinsed with ultrapure water for 45 seconds.

Subsequently, the entire pattern was subjected to full-area exposure at 300 mJ/cm$^2$ using an extra-high pressure mercury lamp.

Subsequently, an overcoat layer was formed under one of the following conditions.

<1> A Coat Formation of the Overcoat Layer of Polyvinyl Alcohol

PVA205 (polyvinyl alcohol manufactured by Kuraray Co., Ltd.) was dissolved in water to obtain a 15 wt % aqueous solution thereof. The aqueous solution of PVA 205 was spin coated on a pattern to cover the resin pattern, and then the substrate was heat-treated at 190° C. for 30 minutes. Subsequently, the overcoat layer was removed by washing with water to obtain a resin pattern.

<2> A Coat Formation of the Overcoat Layer of an Acrylic Resin

Copolymer of benzyl methacrylate and methacrylic acid (weight average molecular weight of 10,000, copolymerization ratio of 80:20 mol %) was dissolved in propylene glycol monomethyl ether acetate to obtain a 15 wt % solution thereof. The solution was spin coated on a pattern to cover the resin pattern, and then the substrate was heat-treated at 210° C. for 30 minutes. The overcoat layer was removed by washing with a 0.4 wt % aqueous solution of tetramethylammonium hydroxide, and further washed with water to obtain a resin pattern.

(2') Production and Evaluation of Resin Pattern without Exposure after Development (Examples 11 to 18).

A photosensitive resin composition was slit coated on a silicon wafer having a silicon oxide film. Subsequently, the solvent was removed by heating on a hot plate at 90° C. for 120 seconds. Thus, a coating film having a thickness of 15 μm was formed.

Subsequently, the film was exposed through a predetermined mask using an i-line stepper (FPA-3000 i5+ manufactured by Canon, Inc.) with an optimum exposure amount.

Subsequently, the substrate was developed by a paddling method using a 2.38% aqueous solution of tetramethylammonium hydroxide at 23° C. for 90 seconds. The substrate was rinsed with ultrapure water for 45 seconds.

Here, a resin pattern was formed without an exposure after the development.

<1'> A Coat Formation of the Overcoat Layer of Hydroxypropyl Methylcellulose

Hydroxypropyl methylcellulose (TC-5E manufactured by Shin-Etsu Chemical Co., Ltd.) was dissolved in water to obtain a 17 wt % aqueous solution thereof. This solution was spin coated on a pattern to cover the resin pattern, and then the substrate was heat-treated at 100° C. for 30 minutes, and further heat-treated at 220° C. for 30 minutes. Subsequently, the overcoat layer was removed by washing with water to obtain a resin pattern.

<2'> A Coat Formation of the Overcoat Layer of Cyclodextrin

α-Cyclodextrin (CAVAMAX W6 manufactured by Cyclochem Co., Ltd. KK) was dissolved in water to obtain a 13 wt % aqueous solution thereof. This solution was spin coated on a resin pattern to cover the resin pattern. Then, the substrate was heat-treated at 140° C. for 30 minutes, and subsequently, the overcoat layer was removed by washing with water. Further, the substrate was heat-treated at 220° C. for 30 minutes to obtain a resin pattern.

—Evaluation of Taper Angle—

The cross-section of the produced line-and-space pattern was observed with a scanning electron microscope (SEM), and the taper angle was measured.

Grades 1 to 3 were considered as levels without any problem in practical use. The image of the shape is shown in FIG. 1.

1: A taper angle of the line cross-section is equal to or larger than 80° and equal to or less than 90°

2: A taper angle of the line cross-section is equal to or larger than 75° and less than 80°

3: A taper angle of the line cross-section is equal to or larger than 70° and less than 75°

4: A taper angle of the line cross-section is equal to or larger than 60° and less than 70°

5: A taper angle of the line cross-section is less than 60°

—Evaluation of Rectangle Formability for Upper End of Pattern—

Furthermore, the upper end of the pattern (one example is 14 in FIG. 2) produced in (2) described above was evaluated based on the rectangle formability. The pattern of which the upper end is rectangular (angular), is preferable. In addition, the image of the shape is shown in FIG. 3.

1: The upper end is sharply angular.

2: The upper end is angular, but the tip of the edge is slightly rounded.

3: The upper end is not angular, and is rounded.

—Evaluation of Rectangle Formability for Lower End of Pattern—

Figure 2:
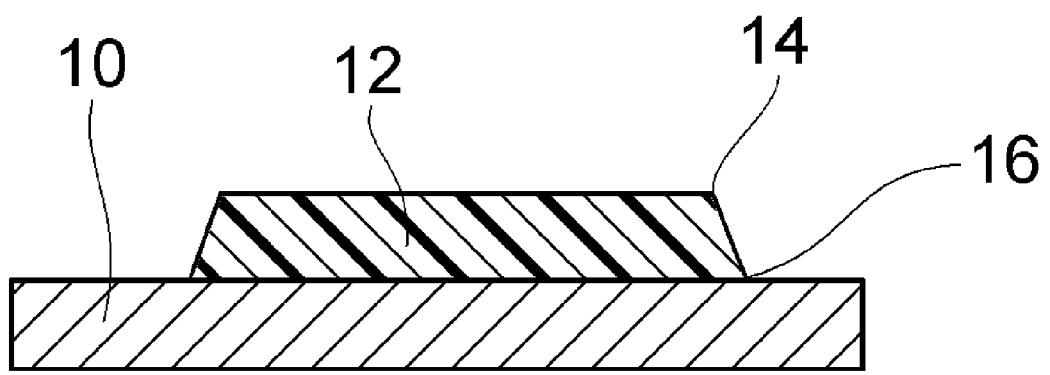
FIG. 2 is a schematic diagram showing the upper end and the lower end of a resin pattern in one example of a resin pattern.
Figure 3:
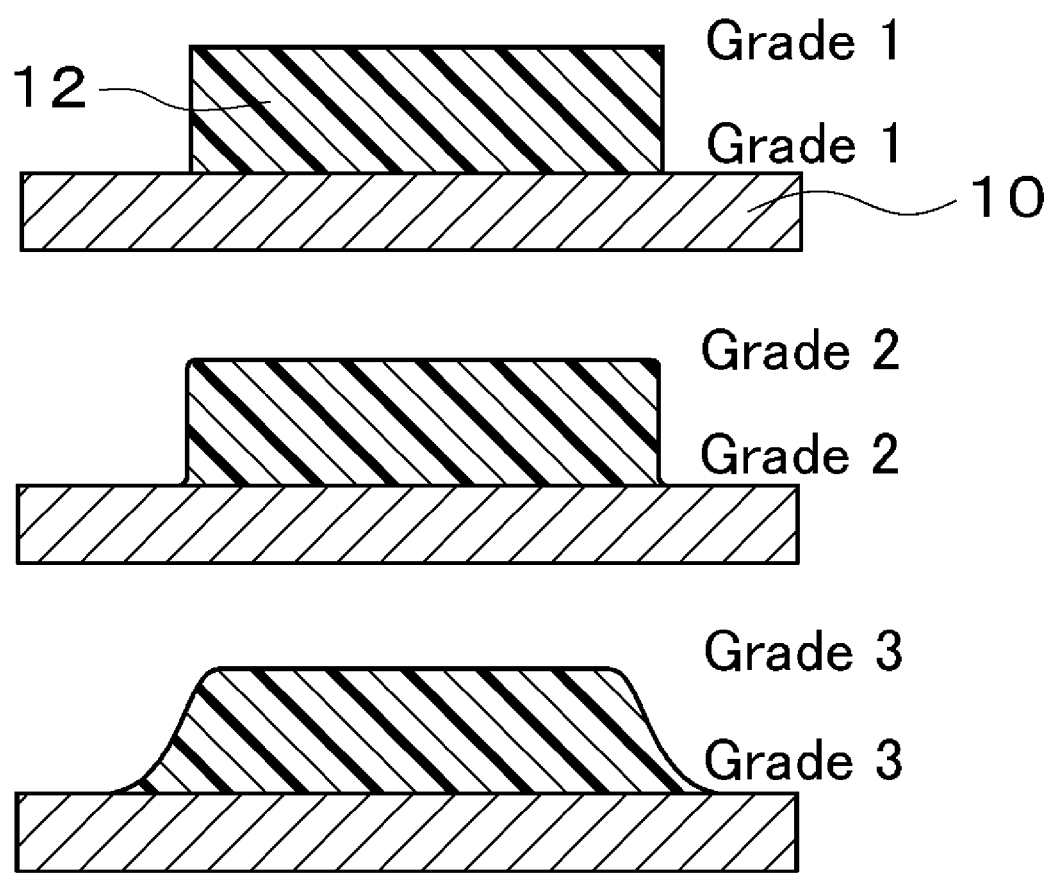
FIG. 3 is a schematic diagram showing an example of the rectangle-forming properties of the upper end and the lower end of a resin pattern as one example of a resin pattern in the cross-section profile after a heat treatment.

Furthermore, the lower end of the pattern (the contact point with the substrate; one example thereof is 16 in FIG. 2) produced in (2) described above was evaluated based on the rectangle formability. The pattern of which the lower end is rectangular (angular), is preferable. In addition, the image of the shape is shown in FIG. 3.

1: The lower end is sharply angular. Specific example thereof includes the state of Example 1.

2: The lower end is angular, but the tip of the edge is slightly rounded.

3: The lower end is not angular, and is rounded.

The test conditions and the evaluation results for Examples 1 to 18 and Comparative Examples 1 to 9 are shown in Table 4.

TABLE 4

| | Composition | Protective layer | Taper angle | Upper end of Pattern | Lower end of Pattern |
|---|---|---|---|---|---|
| Example 1 | Composition 1 | PVA205 | 2 | 1 | 1 |
| Example 2 | Composition 2 | PVA205 | 2 | 1 | 1 |
| Example 3 | Composition 3 | PVA205 | 2 | 1 | 1 |
| Example 4 | Composition 4 | PVA205 | 3 | 2 | 1 |
| Example 5 | Composition 5 | PVA205 | 1 | 1 | 1 |
| Example 6 | Composition 6 | PVA205 | 2 | 1 | 2 |
| Example 7 | Composition 7 | Acrylic | 1 | 1 | 1 |
| Example 8 | Composition 7 | PVA205 | 3 | 2 | 2 |
| Example 9 | Composition 8 | PVA205 | 3 | 2 | 2 |
| Example 10 | Composition 9 | PVA205 | 2 | 1 | 2 |
| Example 11 | Composition 1 | TC-5E | 1 | 1 | 1 |
| Example 12 | Composition 2 | TC-5E | 1 | 1 | 1 |
| Example 13 | Composition 3 | TC-5E | 1 | 1 | 1 |
| Example 14 | Composition 4 | TC-5E | 2 | 1 | 1 |
| Example 15 | Composition 5 | TC-5E | 1 | 1 | 1 |
| Example 16 | Composition 6 | Cyclodextrin | 2 | 1 | 2 |
| Example 17 | Composition 7 | Cyclodextrin | 3 | 2 | 2 |
| Example 18 | Composition 8 | Cyclodextrin | 3 | 2 | 2 |
| Comparative Example 1 | Composition 1 | Without | 5 | 3 | 3 |
| Comparative Example 2 | Composition 2 | Without | 5 | 3 | 3 |
| Comparative Example 3 | Composition 3 | Without | 5 | 3 | 3 |
| Comparative Example 4 | Composition 4 | Without | 5 | 3 | 3 |
| Comparative Example 5 | Composition 5 | Without | 5 | 3 | 3 |
| Comparative Example 6 | Composition 6 | Without | 5 | 3 | 3 |
| Comparative Example 7 | Composition 7 | Without | 5 | 3 | 3 |
| Comparative Example 8 | Composition 8 | Without | 5 | 3 | 3 |
| Comparative Example 9 | Composition 9 | Without | 5 | 3 | 3 |

(Notes)
TC-5E: Hydroxypropyl methylcellulose

The coat formation of the overcoat layer improves the taper angle, and the rectangle formabilities of the upper and the lower ends of the pattern. The first embodiment is particularly preferable from the viewpoint of taper angle and rectangle formability.

(3) Production of MEMS and Evaluation of Operation 1

In the method for coating and forming of the overcoat layer on the resin pattern obtained by developing the photosensitive composition 5, as a desired pattern, a MEMS shutter device and a display apparatus using a 5-inch MEMS shutter device were produced according to the method described in JP-T-2008-533510 using the pattern as a sacrificial layer. When the produced display apparatus was driven, the image was clearly displayed.

(4) Production of MEMS and Evaluation of Operation 2

In order to produce the micromachine described in JP-A-2000-343463 as a MEMS, MEMS devices were produced using the photosensitive resin composition 5 as the resist film of FIG. 20 shown in the patent document, with a desired pattern in the method for coating and forming of the overcoat layer on the resin pattern obtained by developing the composition, and the performance as a the microsensors was evaluated. As a result, satisfactory device characteristics were obtained.

(5) Evaluation as Etching Resist

Photosensitive resin composition 5 was slit coated on a silicon wafer substrate.

Subsequently, the solvent was removed to a hot plate at 90° C. for 120 seconds. Thus, a coating film having a thickness of 4.0 μm was formed.

Subsequently, the film was exposed through a predetermined mask using an i-line stepper (FPA-3000 i5+ manufactured by Canon, Inc.) with an optimum exposure amount.

Subsequently, the substrate was developed by a paddling method using a 0.4 wt % aqueous solution of tetramethylammonium hydroxide at 23° C. for 60 seconds. The substrate was rinsed with ultrapure water for 45 seconds.

Subsequently, the entire pattern was subjected to full-area exposure at 300 mJ/cm² using an extra-high pressure mercury lamp.

The aforementioned overcoat layer was coated thereon and formed.

Subsequently, the substrate was heat-treated at 230° C. for 20 minutes to obtain a resist pattern.

In order to etch the silicon wafer substrate, the dry etching was performed for 90 seconds using a dry etching apparatus manufactured by PMT Co. (Pinnacle 8000) under the conditions of $CF_4$ as an etching gas, a gas flow rate of 75 sccm, a pressure of 2.5 mTorr, and an output of 2,500 W.

The substrate was immersed in a mixed solution of dimethyl sulfoxide and N,N-dimethylformamide (weight ratio=50:50) for 10 minutes to release the resin film portion.

When it was observed with an optical microscope and an electron microscope, it was confirmed that a rectangular pattern which had reproduced a mask pattern thoroughly on a silicon water, was obtained.

(6) Evaluation as a Resist for Forming Bump

<Formation of Pattern>

Photosensitive resin composition 5 was coated on a gold sputtered substrate by means of a spin coater, and then heated on a hot plate at 90° C. for 5 minutes. Thus, a resin film having a thickness of 25 μm was formed. Subsequently, the resin film was exposed through a pattern mask using an extra-high pressure mercury lamp (HBO manufactured by OSRAM, output: 1,000 W) with an optimum exposure amount.

The resin film was developed by immersing for 90 seconds at room temperature (25° C.) using a 2.38 wt % aqueous solution of tetramethylammonium hydroxide, and then washed under flowing water.

The entire pattern was subjected to full-area exposure at 500 mJ/cm² using an extra-high pressure mercury lamp (HBO manufactured by OSRAM, output: 1,000 W).

The aforementioned overcoat layer was coated thereon and formed.

Subsequently, the substrate was heat-treated at 230° C. for 20 minutes to obtain a resist pattern. Hereinafter, the substrate with this resin pattern formed thereon is referred to as a "patterning substrate (A)".

<Formation of Plated Shaped Article>

The patterning substrate (A) was subjected to an ashing treatment with oxygen plasma (output: 100 W, oxygen flow rate: 100 ml, treatment time: 1 minute) as a pretreatment for electroplating, to make the pattern substrate hydrophilic. Subsequently, the substrate was immersed in 1 liter of a gold cyanide plating solution (trade name: Temperex 401, manufactured by Electroplating Engineers of Japan Ltd.), and subjected to electroplating for about 60 minutes under the conditions of a plating bath temperature of 44° C. and a current density of 0.7 A/dm² to form a plated shaped article for a bump having a thickness of 20 μm. Then, the substrate was washed under flowing water and blown with nitrogen gas to dry it. Thereafter, the substrate was immersed in a mixed solution of dimethyl sulfoxide and N,N-dimethylformamide (weight ratio=50:50) for 10 minutes to release the resin film portion, and further a portion of the conductive layer on the substrate other than the region where the plated shaped article had been formed was removed by wet etching to obtain a substrate having a plated shaped article.

When it was observed with an optical microscope and an electron microscope, it was confirmed that the plated pattern had reproduced a mask pattern thoroughly.

What is claimed is:

1. A method for producing a resin pattern, the method comprising at least the steps (1) to (7) in this order:
   (1) A coating step of coating a photosensitive resin composition on a substrate;
   (2) A solvent removal step of removing the solvent from the applied photosensitive resin composition;
   (3) An exposure step of patternwise exposing the photosensitive resin composition from which the solvent has been removed, to an active radiation;
   (4) A development step of developing the exposed photosensitive resin composition using an aqueous developer liquid;
   (5) An overcoating step of providing an overcoat layer on the developed photosensitive resin composition;
   (6) A heat-treating step of heat-treating the photosensitive resin composition on which the overcoat layer has been provided; and
   (7) a removal step of removing the overcoat layer,
   wherein:
   the overcoat layer contains a compound selected from the group consisting of dextrins, celluloses and poly(meth) acrylic acid ester copolymers, and
   the thickness of the resin pattern after the heat treatment step of step (6) is 4 to 100 μm.

2. The method for producing a resin pattern according to claim 1, wherein the method further includes a post-exposure step of performing full-area exposure of the substrate with a pattern formed thereon to active radiation, between step (4) and step (5), or between step (5) and step (6).

3. The method for producing a resin pattern according to claim 1, wherein the cross-sectional taper angle of the resin pattern after the heat treatment step of step (6) is 70° or larger.

4. The method for producing a resin pattern according to claim 1, wherein the photosensitive resin composition contains the following components:
   (Component A1) a polymer including a monomer unit (a1-1) having a residue of a carboxyl group or a phenolic hydroxyl group protected with an acid-decomposable group, and a monomer unit (a1-2) having an epoxy group and/or an oxetanyl group;
   (Component B1) a photo acid generator; and
   (Component C1) a solvent.

5. The method for producing a resin pattern according to claim 4, wherein the photosensitive resin composition further contains (Component D1) a thermal crosslinking agent.

6. The method for producing a resin pattern according to claim 5, wherein Component D1 includes a blocked isocyanate compound.

7. The method for producing a resin pattern according to claim 4, wherein Component A1 further has a monomer unit (a1-3) having a cyclic structure, in addition to the monomer units (a1-1) and (a1-2).

8. The method for producing a resin pattern according to claim 4, wherein Component A1 further has a monomer unit (a1-4) having a carboxyl group or a hydroxyl group, in addition to the monomer units (a1-1) and (a1-2).

9. The method for producing a resin pattern according to claim 4, wherein the content of the monomer unit (a1-1) in Component A1 is 45 mol % or less based on all the monomer units of Component A1.

10. The method for producing a resin pattern according to claim 1, wherein the photosensitive resin composition is a chemically amplified positive type photosensitive resin composition.

11. The method for producing a resin pattern according to claim 1, wherein the photosensitive resin composition contains the following components:

(Component A2) a polymer including a constitutional unit (a2-1) having a carboxyl group or a phenolic hydroxyl group, and a constitutional unit (a2-2) having an epoxy group and/or an oxetanyl group;
(Component B2) a quinonediazide compound; and
(Component C2) a solvent.

12. The method for producing a resin pattern according to claim 1, wherein the photosensitive resin composition contains the following components:

(Component A3) a polymer having a carboxyl group or a phenolic hydroxyl group;
(Component B3) a photopolymerization initiator;
(Component C3) a solvent; and
(Component D3) a polymerizable monomer.

13. The method for producing a resin pattern according to claim 1, wherein the overcoat layer contains a compound selected from the group consisting of celluloses.

14. The method for producing a resin pattern according to claim 1, wherein the overcoat layer consists of a compound selected from the group consisting of dextrins, celluloses and poly(meth)acrylic acid ester copolymers.

15. The method for producing a resin pattern according to claim 1, wherein in the removal step, the overcoat layer is removed by an aqueous liquid.

16. A method for producing a MEMS structure, the method comprising using the resin pattern produced by the method for producing a resin pattern according to claim 1 as a structural component.

* * * * *